United States Patent
Sun et al.

(10) Patent No.: US 11,300,714 B2
(45) Date of Patent: Apr. 12, 2022

(54) 3D/FLIP/MOTION PHOTO-SUBSTRATE, IMAGING PROCESSES, AND APPLICATIONS THEREOF

(71) Applicant: SUN CHEMICAL CORPORATION, Parsippany, NJ (US)

(72) Inventors: Bo Sun, Bardonia, NY (US); Jerome Moyer, West New York, NJ (US); Philippe Schottland, Sparta, NJ (US); Danny Rich, Trenton, NJ (US)

(73) Assignee: Sun Chemical Corporation, Parsippany, NJ (US)

( * ) Notice: Subject to any disclaimer, the term of this patent is extended or adjusted under 35 U.S.C. 154(b) by 0 days.

(21) Appl. No.: 17/147,652

(22) Filed: Jan. 13, 2021

(65) Prior Publication Data

US 2021/0190997 A1    Jun. 24, 2021

Related U.S. Application Data

(62) Division of application No. 16/317,201, filed as application No. PCT/US2017/041640 on Jul. 12, 2017, now abandoned.
(Continued)

(51) Int. Cl.
*G03F 7/20* (2006.01)
*G02B 3/00* (2006.01)
(Continued)

(52) U.S. Cl.
CPC .......... *G02B 3/0056* (2013.01); *B65D 33/04* (2013.01); *G02B 3/0043* (2013.01); *G02B 27/06* (2013.01); *G02B 30/27* (2020.01); *G03B 35/08* (2013.01); *G03B 35/18* (2013.01); *G03C 7/14* (2013.01); *G03F 7/2002* (2013.01); *G03F 7/2039* (2013.01)

(58) Field of Classification Search
CPC .... G02B 3/0056; G02B 30/27; G03B 3/0043; G03F 7/2002; G03F 7/2039
USPC ..................................... 430/380; 355/27, 77
See application file for complete search history.

(56) References Cited

U.S. PATENT DOCUMENTS

| | | | |
|---|---|---|---|
| 5,539,487 A * | 7/1996 | Taguchi ................. | G02B 30/27 396/330 |
| 6,288,842 B1 | 9/2001 | Florczak et al. | |

(Continued)

OTHER PUBLICATIONS

International Search Report issued in International Application No. PCT/US2017/041640, dated Sep. 22, 2017.
(Continued)

*Primary Examiner* — Hung Nguyen
(74) *Attorney, Agent, or Firm* — Marian E. Fundytus; Ostrolenk Faber LLP.

(57) ABSTRACT

The present invention provides a photo-substrate for printing of lenticular images that comprises a lenticular lens array, and an energy-reactive material adhered to the backside of the lenticular lens array. According to the methods of the present invention, the lenticular image is printed directly through the lenticular lens array onto the energy-reactive material, using, for example, collimated light or laser. The photo-substrate of the present invention can be adapted for large scale or industrial production to print lenticular images on a wide array of substrates, including such things as packaging and clothing.

8 Claims, 19 Drawing Sheets

Related U.S. Application Data

(60) Provisional application No. 62/362,819, filed on Jul. 15, 2016, provisional application No. 62/407,707, filed on Oct. 13, 2016, provisional application No. 62/407,713, filed on Oct. 13, 2016.

(51) Int. Cl.

| | | |
|---|---|---|
| G03C 7/14 | (2006.01) | |
| G02B 27/06 | (2006.01) | |
| B65D 33/04 | (2006.01) | |
| G03B 35/18 | (2021.01) | |
| G02B 30/27 | (2020.01) | |
| G03B 35/08 | (2021.01) | |

(56) References Cited

U.S. PATENT DOCUMENTS

| | | |
|---|---|---|
| 7,981,499 B2 | 7/2011 | Endle et al. |
| 8,964,297 B2 | 2/2015 | Hoffman et al. |
| 9,310,672 B2 | 4/2016 | Nakamura |
| 9,383,588 B2 | 7/2016 | Raymond et al. |
| 9,392,260 B2 | 7/2016 | Imamura et al. |
| 2007/0019306 A1 | 1/2007 | Wu et al. |
| 2010/0027114 A1 | 2/2010 | Zuidema et al. |
| 2010/0134895 A1 | 6/2010 | Hoffman et al. |
| 2010/0278480 A1 | 11/2010 | Vasylyev |
| 2013/0154250 A1 | 6/2013 | Dunn |
| 2016/0190194 A1 | 6/2016 | Astratov et al. |
| 2017/0139093 A1* | 5/2017 | Schmitt ................ B42D 25/364 |

OTHER PUBLICATIONS

Written Opinion of the International Searching Authority issued in International Application No. PCT/US2017/041640, dated Sep. 22, 2017.

International Preliminary Report issued in PCT/US2017//041640, dated Sep. 22, 2017.

* cited by examiner

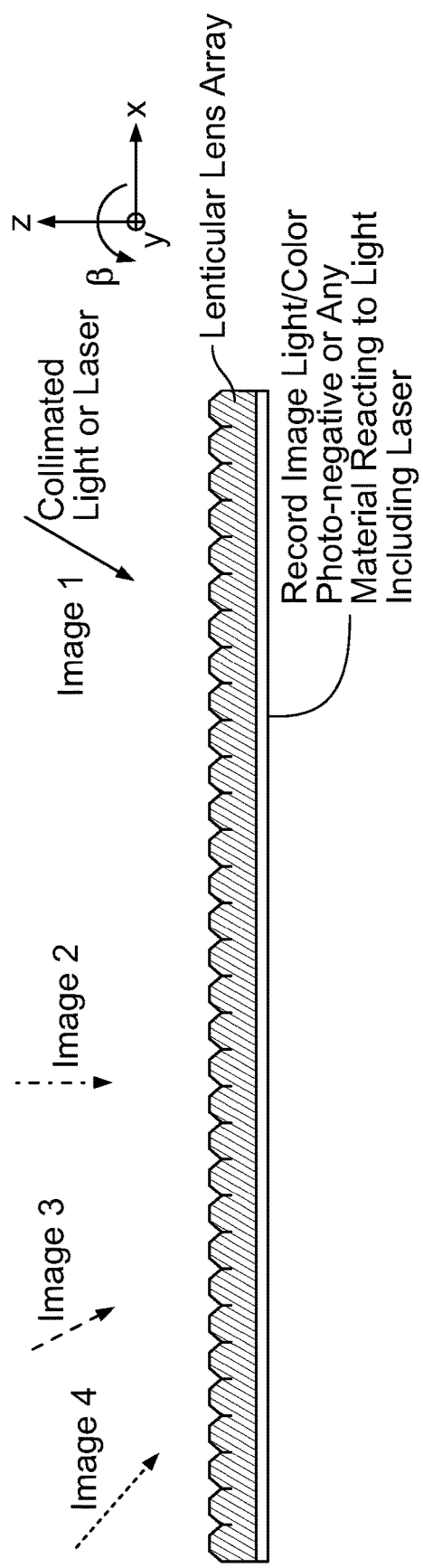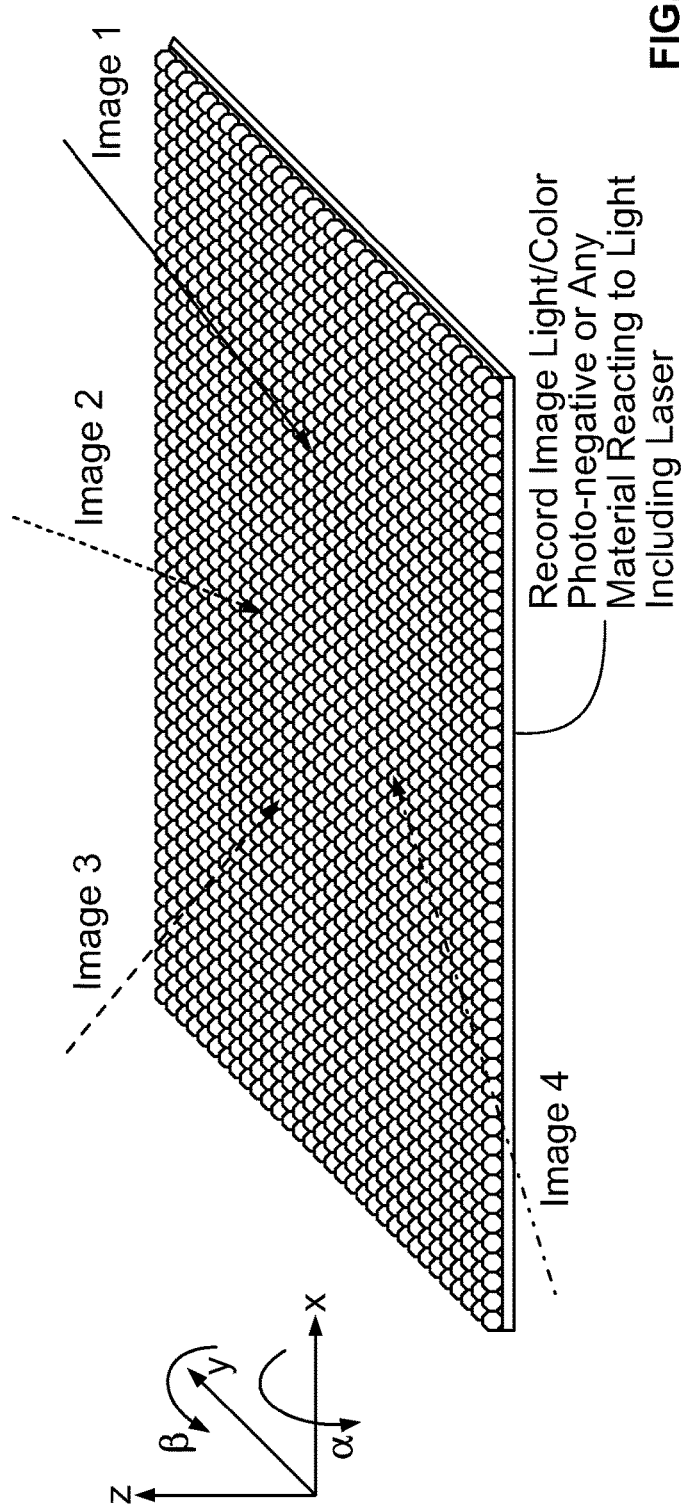
FIG. 1a
FIG. 1b

1) Images Recording Using Collimated Light in Dark Room or Laser in Common Light Environment

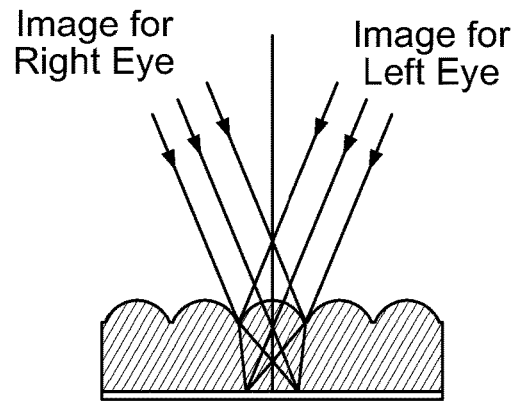

Images Developed at Different Locations on Focal Plane

2) Reverse the Light Channels when Viewing

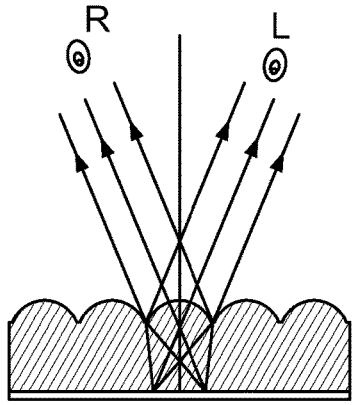

Image Recorded Reflecting Light Back to Eyes Using the Same Channels, But in Reverse

FIG. 2a

IR Light or Any Wave with Wavelength Larger than that of Visible Light, Used in Image Recording

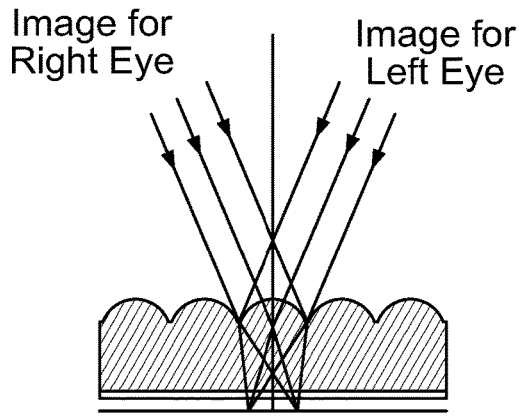

Images are Focused on the Plane Outside the Photo-reacting Material, Causing Out-of-focus.

FIG. 2b

UV, X-ray Light or Any Wave with Wavelength Less than that of Visible Light, Used in Image Recording

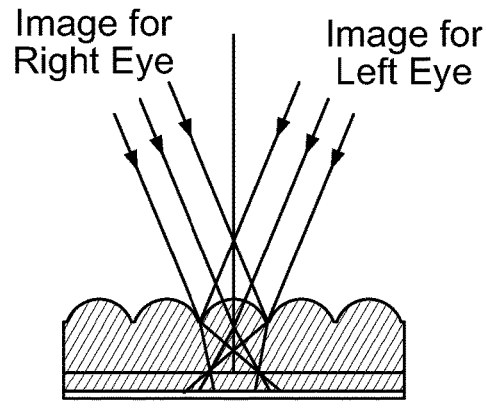

Images are Focused on the Plane Inside, But not on the Photo-reacting Material, Causing Out-of-focus.

FIG. 2c

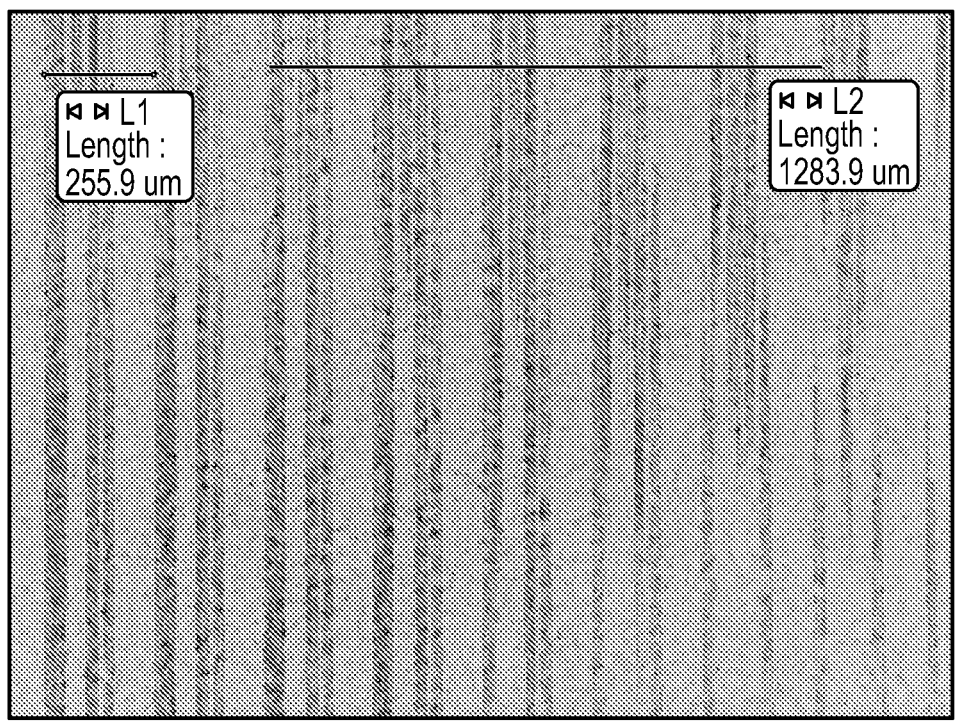
FIG. 9a1

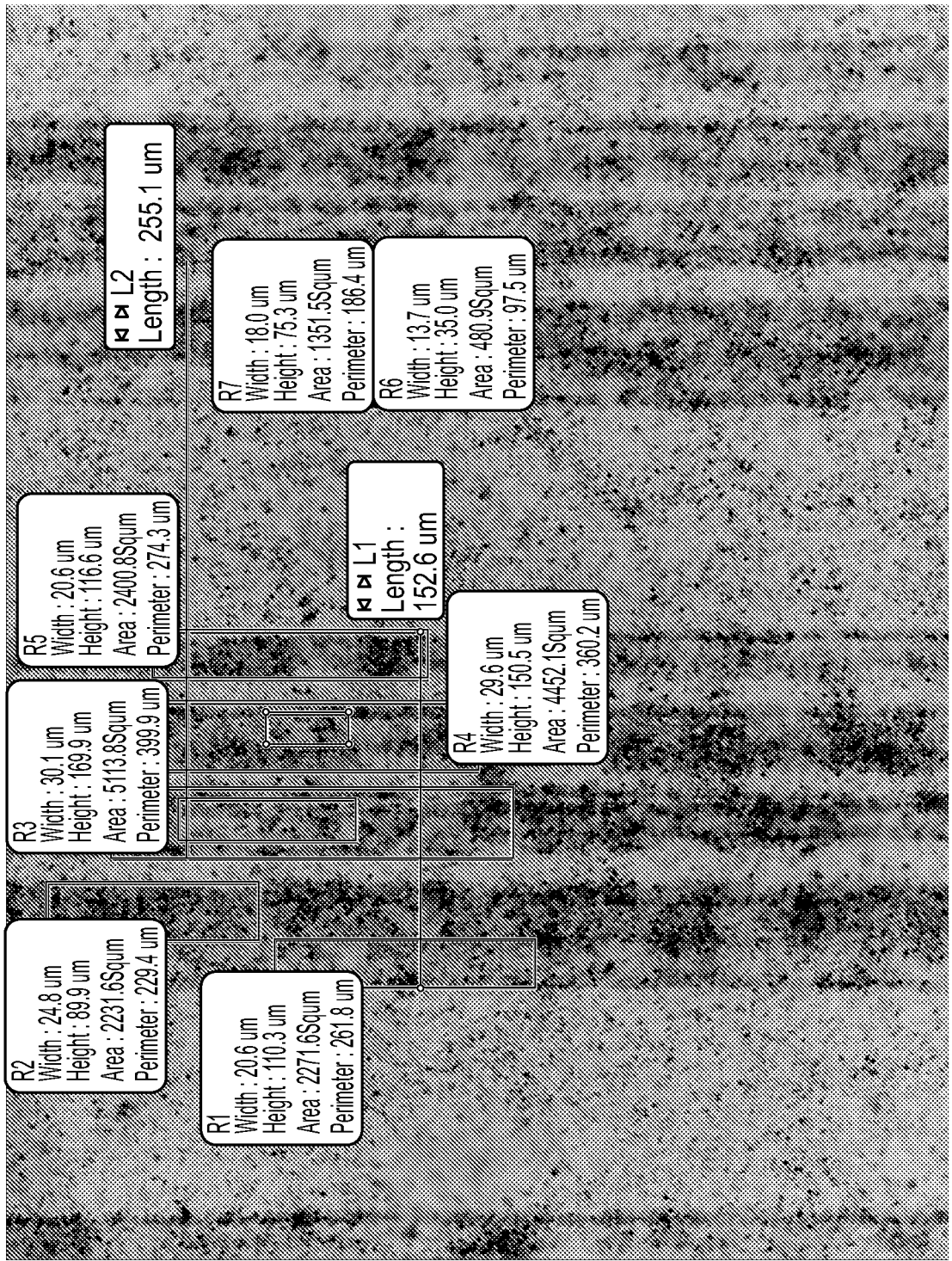
FIG. 9a2

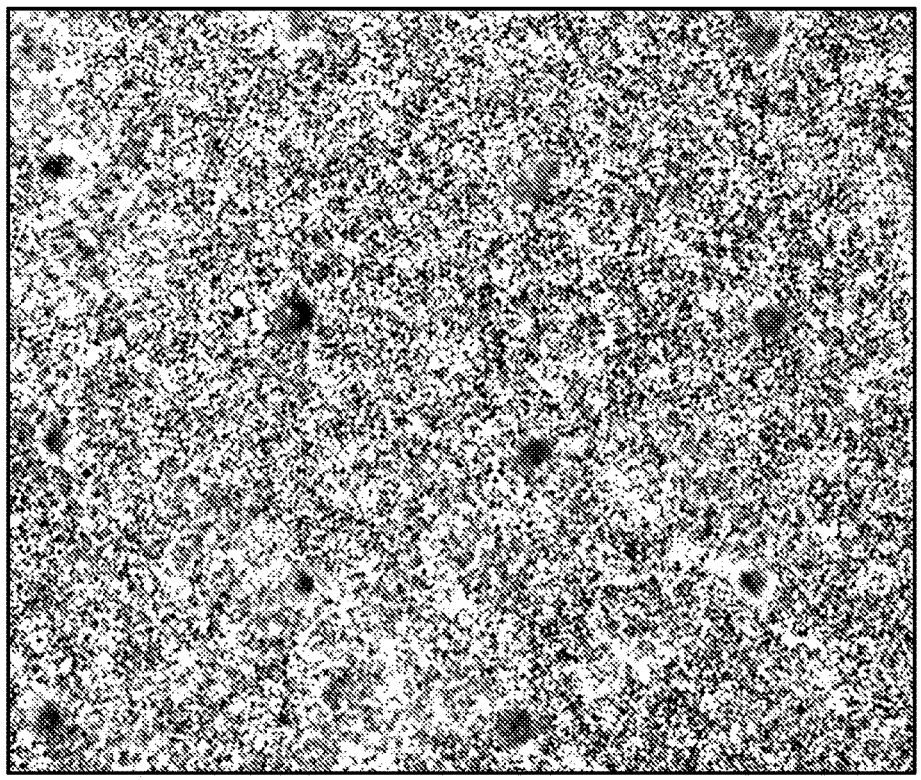
FIG. 9b1
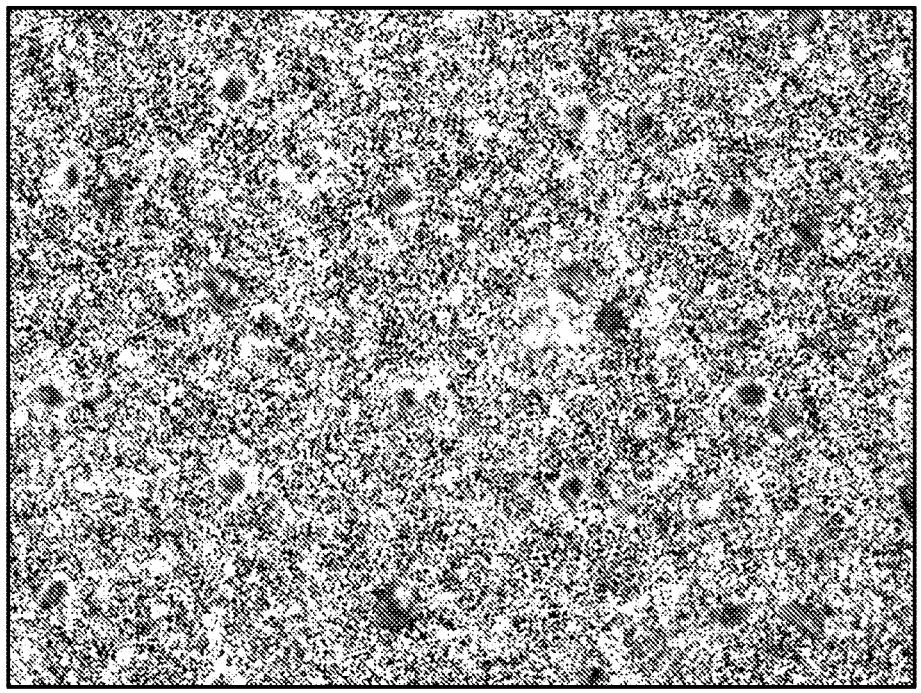
FIG. 9b2

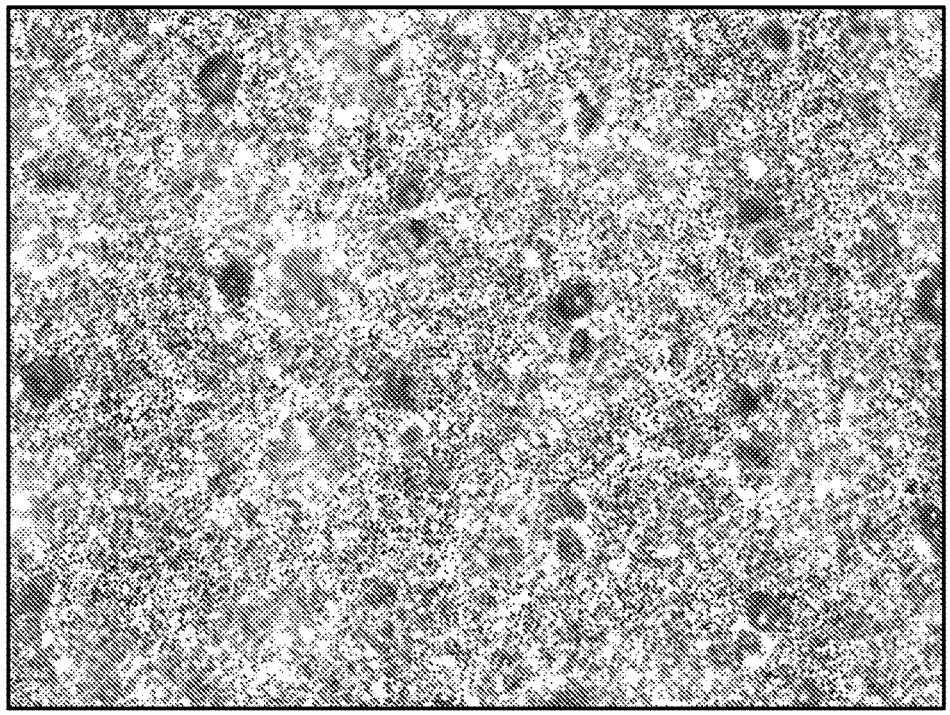
FIG. 9b3
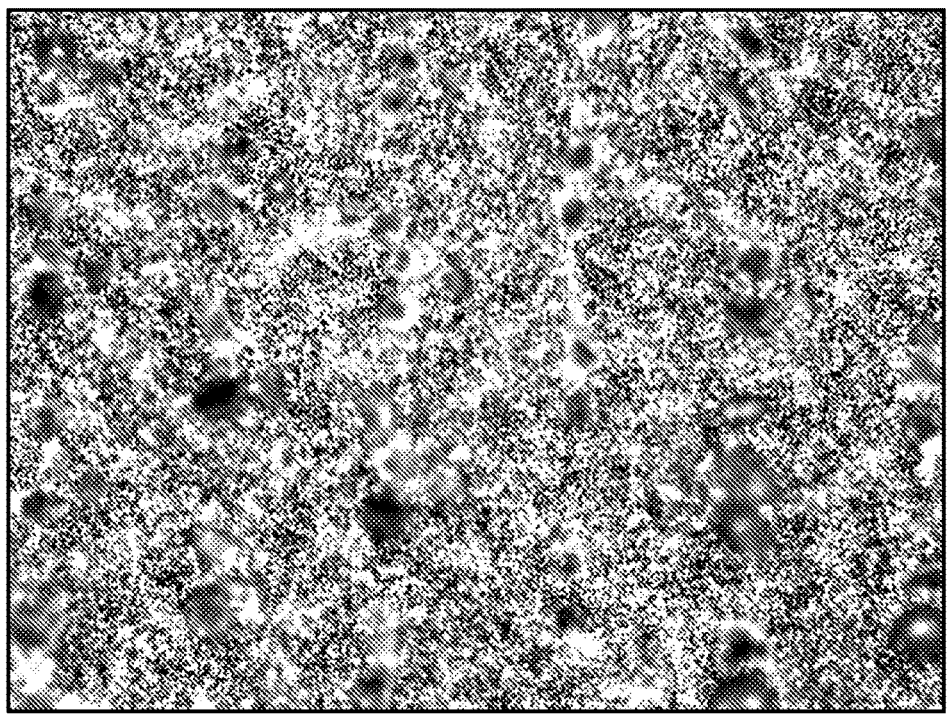
FIG. 9b4

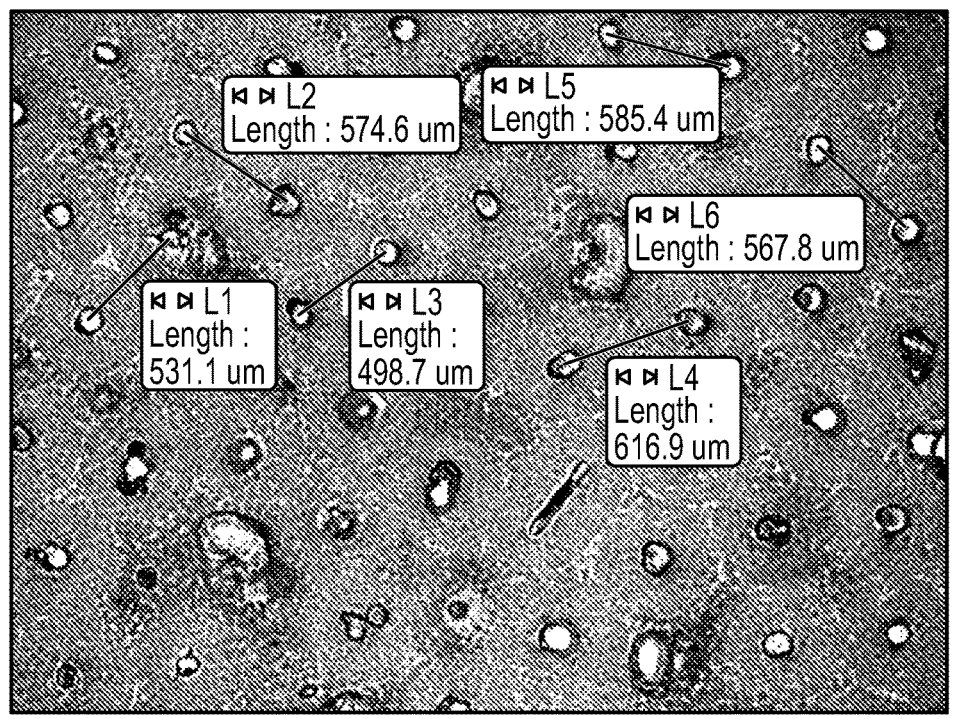
FIG. 9c1
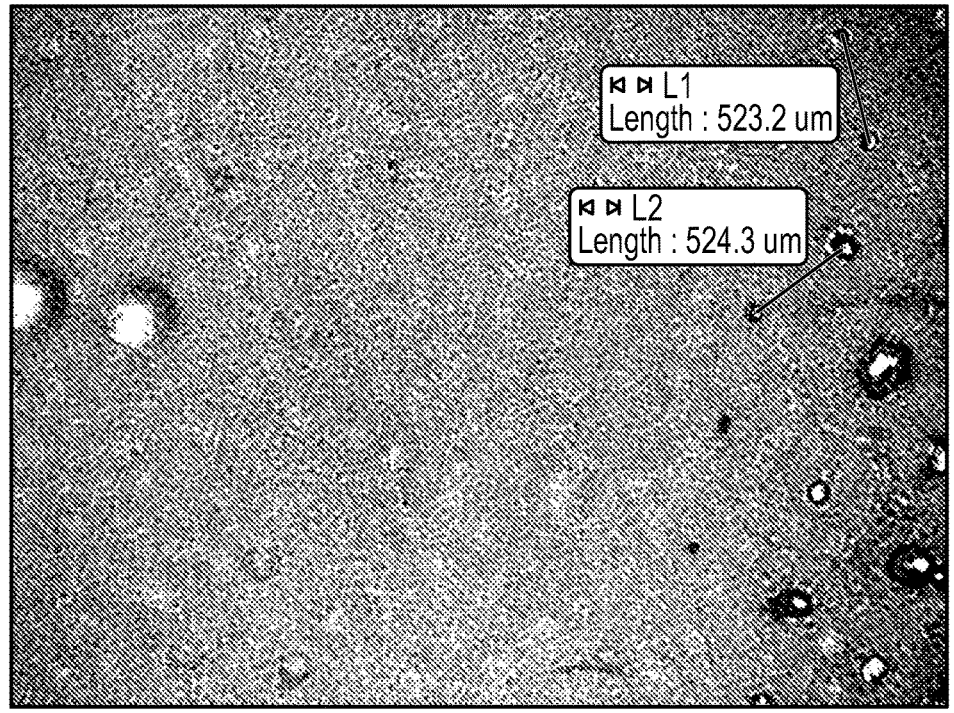
FIG. 9c2

FIG. 11
| Art Ex. | Images used at different β angles of incidence of collimated light on photo-substrate ||| 3D/Flip Effect | Used for Ex# of Table 1 |
|---|---|---|---|---|---|
| | Image 1 [β angles] | Image 2 [β angles] | Image 3 [β angles) | | |
| A | Logo Motion [-30°, 0°, +30°] | Sun Lase [-15°, +15°] | | Flip | #1-6 |
| B |  [-20°] |  [-15°, +15°] | 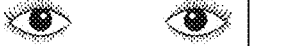 [20°] | Flip | #1-6 |
| C |  [-18°] |  [+18] | | Flip | #6 |
| D | 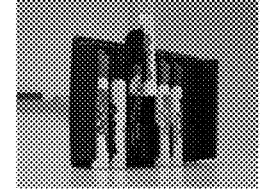 [-3°] | 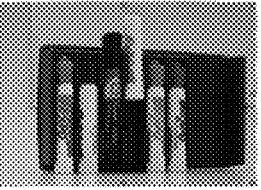 [+3°] | | 3D | #1-2 |
| E |  [-6°] |  [0°] |  [+6°] | 3D | #1-2 |
| F | 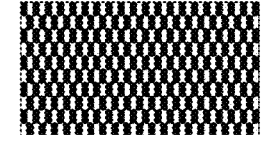 [0°] | | | Flip | #7-8 |
| G | Color-inverted image of 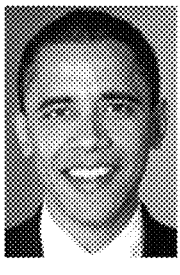 [0°] | | | Flip | #7-8 |

FIG. 12
| Art Ex. | Images used at different (α, β)* angles of incidence of collimated light on photo-substrate | | | | 3D/Flip Effect | Used for Ex# of Table 1 |
|---|---|---|---|---|---|---|
| | Image 1 [(α, β) angles] | Image 2 [(α, β) angles] | Image 3 [(α, β) angles] | Image 4 [(α, β) angles] | | |
| H | Logo Motion [(0°, −30°)] | Sun Lase [(0°, +30°)] |  [(−30°, 0°)] | 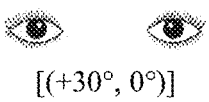 [(+30°, 0°)] | Flip | #9-15 |

3D/FLIP/MOTION PHOTO-SUBSTRATE, IMAGING PROCESSES, AND APPLICATIONS THEREOF

CROSS-REFERENCE TO RELATED APPLICATIONS

The present application is a divisional application of U.S. application Ser. No. 16/317,201 filed Jan. 11, 2019, abandoned, which is a § 371 National Phase application based on PCT/US2017/041640 filed Jul. 12, 2017, which claims the benefit of U.S. Provisional Application Nos. 62/362,819, filed Jul. 15, 2016, 62/407,707 filed Oct. 13, 2016 and 62/407,713 filed Oct. 13, 2017, the subject matter of each of which is incorporated by reference in their entirety.

FIELD OF THE INVENTION

The present invention is related to lenticular printing. The photo-substrate comprising a lenticular lens of the invention, and the methods of the invention, can be used to produce special effects in printed images, such as 3D, flip, and motion effects.

BACKGROUND

It is often desirable to print images that, when viewed at different angles, appear as 3D, flip, or moving images. This is known as lenticular printing. The standard method for producing these images is time-consuming, laborious, and often not accurate.

Lenticular printing is a method of printing an image in which lenticular lenses are used to produce an illusion of depth, flipping, or motion effects, when the image is viewed from different angles. Lenticular lenses are also used to produce 3D displays.

Prior art lenticular printing methods require building up two separate and distinctive images, then splitting each image into a multitude of strips or grids using digital imaging filters. The filtered images are then digitally combined to produce a composite image in which the image segments are some fraction of the 1D or 2D spacing of the lenticular arrays, called interlacing of the images, and the interlacing algorithm or software is only available for linear lenticular lens.

The interlaced image can be printed directly to the backside of the lens, for example using lithographic or screen printing. However, when printing to the backside of the lens, it is critical that the registration (alignment) of the fine "slices" of interlaced images be absolutely correct during the printing process. If the registration is not perfect, defects such as "ghosting" and poor imagery may result.

The interlaced image may also be printed onto a substrate (e.g. paper), and then the printed substrate is laminated to the lens. Again, registration of the image with the lens sheet is critical, or poor imaging will occur.

A typical procedure for producing a lenticular print is as follows:
1) Artwork preparation, where some of the individual elements are prepared in different layers;
2) Interlacing;
3) Virtual proofing for different effects on computers;
4) Printing the artwork;
5) Aligning the lenticular lens to the picture, and laminate.

As mentioned, available software for interlacing the images does not provide an algorithm to interlace images for any lens array other than a linear lenticular lens array. Thus, other types of lenticular lens arrays, such as honeycomb-structured and spherical lens arrays are even more difficult to use. Misalignment could cause ghost image, double images, blurred images, and dizzy images. The precision limit for the registration using the current methods is 1 dot out of 1200-2400 dots per inch (dpi) on a printer, which is equivalent to about 11 to about 22 microns. This imprecise registration not only reduces the image quality, but also eliminates the commercial application of lenticular lenses thinner than 100 microns. Most commercial lenticular lens products have a thickness greater than 250 microns.

U.S. Pat. No. 9,310,672 describes a method of capturing stereoscopic images through two or more different rolls of films with an equal number of capturing devices. The images are reproduced on a displayer enabled by different techniques.

U.S. Pat. No. 9,383,588 discloses a method of placing interlaced images into a print file for subsequent display with a slanted lenticular lens. Traditional lenticular displays use interlaced images parallel to the long axis of the lenses, but this invention allows the image slices to be rotated to an acute angle to the long axis direction.

U.S. Pat. No. 9,392,260 describes an image pickup device for capturing a 3D image, comprising a lens optical system and an arrayed image pickup element, such as a CCD array. Two images are recorded using Bayer-array pixels at two angles controlled by opening/stopping/closing two separated areas, D1 and D2, in the light channel. The optical interface is composed of two stationary 2D lenticular lens arrays for directing the lights to accurately and efficiently irradiate on the stationary image pickup pixels, and this interface does not need to focus the lights onto the pixels. Four image pickup pixels with an arrayed structure are under a first optical element, similar to Bayer Filter concept; each pixel may be covered under one second microlens. The final 3D image is produced on an electronic imaging display in the form of a video. The intent is to provide a distance accurate stereoscopic view through a medical imaging system, such as an endoscope.

U.S. Pat. No. 8,964,297 describes a high-definition dimensional image display device with a thin lens array, and a method of making it. This is used as a special effects device added to a flexible packaging to improve customer noticeability. The image is printed using conventional printing methods onto the backside of the lenticular lens array, either a linear array, or a "fly's eye" matrix array. The lens array is formed by embossing the substrate, which is a clear film as used in flexible packaging. The material for embossing is first printed on the side of the film opposite the printed image, and the coating is then patterned. The thickness of the embossed patterned lenses is about 5 mils (0.127 mm).

There remains a need in the art for products and/or methods for lenticular printing that are less laborious. There is also a need for products and/or methods that will improve registration of the lenticular lens array with the printed image.

SUMMARY OF THE INVENTION

The present invention not only addresses the defects which result from improper image alignments, as are often seen in commercial 3D or flip lenticular lens products, but also provides a method for using thinner lenticular lenses. The thinner lenticular lenses are much more flexible and enable the 3D or flip image technology to be used in fashion, clothing, packaging, and security features on currency notes, checks, and credit cards, for example. The production process of the present invention does not need software for interlacing different images because the images are automatically interlaced and registered in the photo-reactive material at the backside of the lenticular lens.

The improvement comes from application of the Helmholtz law of reciprocity. The various image slices are produced directly by illuminating the photo-reactive layer with narrowly collimated light or laser beams, for example, in place of the narrowly focused human eye. Thus, the scanned image is imaged through every lens in the array at the same time, but only along the angles which correspond to the subsequent viewing geometry. The substrate is rotated through a small angle and a second image is applied, and a third and so on. Consequently, the present invention simplifies the procedure for 3D film and studio, and large scale production of lenticular images to:

1) Artwork preparation, some of the individual elements are prepared in different layers;
2) Project the images in collimated light/laser incident onto the lenticular 3D film at different angles as desired for a certain exposure time.

The present invention, by its unique image-forming technique, can achieve high-definition by any kind of lens, which itself can focus the image sharply on the photo-reactive material on the backside. Thus, the lens can be of any form.

In a particular aspect, the present invention provides a photo-substrate comprising:
 a) a lenticular lens array; and
 b) a substrate comprising one or more energy-reactive materials adhered to the backside of the lenticular lens array.

In another aspect, the present invention provides method for in-situ image forming and automatic registration of images and lens for producing 3-D, and/or flip, and/or motion effect printed image with a lenticular lens comprising:
 a) providing the photo-substrate of the invention; and
 b) exposing the photo-substrate to energy at different angles and/or depths through the lenticular lens array to form each image, wherein the energy reactive material forms an image at different locations at the focal plane;
wherein the images formed in step b) form images at different angles which correspond to the subsequent viewing geometry, and produce a 3-D and/or flip and/or motion effect of the image.

In one embodiment, the present invention provides a method of producing a 3D and/or flip and/or motion effect printed image or images comprising:
 a) providing the photo-substrate of the invention, wherein the photo-substrate is a continuous web substrate;
 b) loading the photo-substrate on a roller train moving at a speed proportional to the recording ability of the substrate; and
 c) providing one or more Digital Light Processing (DLP) projectors;
wherein the DLP projectors project images at different angles which correspond to the subsequent viewing geometry, at a speed synchronized to the speed of the substrate movement.

In one aspect, the present invention provides a method of producing a 3D and/or flip and/or motion effect printed image or images comprising:
 a) providing the photo-substrate of the invention, wherein the photo-substrate is a continuous web substrate;
 b) loading the photo-substrate on a roller train moving at a speed proportional to the recording ability of the substrate; and
 c) providing one or more lasers, each producing narrow and well collimated beams;
wherein the lasers are scanned and modulated back and forth across the photo-substrate at different angles which correspond to the subsequent viewing geometry, as the photo-substrate is moved.

In another aspect, the present invention provides an apparatus for directly producing 3D and/or flip and/or motion effect(s) printed images comprising:
 a) the photo-substrate of the invention; and
 b) a camera designed to image the photo-substrate comprising:
  i. an optical system to convert incoming light to collimated light; and
  ii. a part for rotating the photo-substrate at different angles with a pivot point or a pivot; and/or
  iii. an optical system to change the incident irradiation angle of collimated light to the 3D photo-substrate; and/or
  iv. a light projection optics to convert the incoming light to the camera for irradiating collimated light to the lenticular photo-substrate at different angles.

In a particular aspect, the present invention provides a printed article comprising the photo-substrate of the invention.

BRIEF DESCRIPTION OF THE DRAWINGS

FIG. 1a: FIG. 1a is an illustration of the lenticular photo-substrate, which is composed of a lenticular lens array and photo-reacting material(s), and allows different images to be formed in-situ at different angles.

FIG. 1b: FIG. 1b is a lenticular photo substrate showing a 2-dimensional angle rotation scheme for hemi-spherical or spherical lens layers. Although the illustration shows single unit lens as square-structures, the relative locations of the unit lenses could be random, and/or ordered, and/or periodical random subunits, and/or random periodical subunits, and/or any of these combinations.

FIG. 2a: FIG. 2a depicts reversible light channels used for forming the images on the photo-reactive material at the focal plane of the lenticular lens array, and viewing the images so formed.

FIG. 2a1: Collimated light for forming the images.

FIG. 2a2: Reverse light channels when viewing the image.

FIG. 2b: FIG. 2b illustrates out-of-focus situations caused by chromatic aberration when IR light, or any wave with a wavelength larger than that of visible light is used.

FIG. 2c: FIG. 2c illustrates out-of-focus situations caused by chromatic aberration when UV, x-ray, or any wave with a wavelength less than that of visible light is used.

FIG. 3a: FIG. 3a depicts a linear lenticular lens array.

FIG. 3b depicts a honey-comb array half-spherical lenticular lens array.

FIG. 3c depicts a square-array half-spherical lenticular lens array.

FIG. 4 illustrates the refractive indices of several possible lenticular lens materials.

FIG. 5a: FIG. 5a is an illustration of a camera with one shutter that can be used with the photo-substrate of the invention.

FIG. 5b is an illustration of a camera with two shutters that can be used with the photo-substrate of the invention. The two shutters could be synchronized.

FIG. 6a: FIG. 6a illustrates one set-up that could be used for roll-to-roll lenticular printing using the photo-substrate of the present invention.

FIG. 6b illustrates an alternative set-up that could be used for roll-to-roll lenticular printing using the photo-substrate of the present invention.

FIG. 6c illustrates one step in the production of a 3D/flip/motion picture in large format, such as 6 ft. by 3 ft.

FIG. 7a: FIG. 7a illustrates a 3D/parallax film for recording and showing parallax movies.

FIG. 7b shows generation of a 3D movie using the photo-substrate of the present invention. The incident angles of the left-eye image and the right-eye image are changed according to the best parallax effect.

FIG. 7c illustrates playing the 3D/parallax movie film, preferably at a speed of 24 frames/sec.

FIG. 8a: FIG. 8a depicts the microscopic picture of the Lenstar 100LPI lens layer used in Examples #3, #6, and #8 of Table 1; the unit length is about 254 μm, and the thickness is about 368 μm.

FIG. 8b depicts the microscopic picture of the Grapac HALS-H 250T-PP honeycomb lens layer used in Examples #9 and #10 of Table 1; unit length is about 127 μm, and the thickness is about 250 μm.

FIG. 8c depicts the microscopic picture of the Glass bead lens layer used in Example #12 of Table 1; each unit glass bead is 500±150 μm.

FIG. 8d depicts the microscopic picture of the Glass bead lens layer used in Example #13 of Table I; each unit glass bead is 124±18 μm.

FIG. 8e depicts the microscopic picture of the MicroBeads Spheromer CA60 PMMA bead lens layer(s) used in Example #14 of Table 1; each unit PMMA bead is 60 μm. The beads are not exactly at the same flat plane, but clear images are regenerated through the lens layer.

FIG. 8f depicts the microscopic picture of the MicroBeads Spheromer CA30 PMMA bead lens layer(s) used in Example #15 of Table 1; each unit PMMA bead is 30 μm. The beads are not exactly at the same flat plane, but clear images are regenerated through the lens layer.

FIG. 9a1: FIG. 9a1 depicts a microscopic picture of marks left on the photo reactive material after image transferring at a 5× magnification of marks left on the photo-substrate of Example #3 of Table 1.

FIG. 9a2: FIG. 9a2 depicts a microscopic picture of marks left on the photo reactive material after image transferring at a 20× magnification of marks left on the photo-substrate of Example #3 of Table I.

FIG. 9b1: FIG. 9b1 depicts a microscopic picture of marks left on the photo reactive material after image transferring of Image area 1 of Example #10 of Table 1.

FIG. 9b2: FIG. 9b2 depicts a microscopic picture of marks left on the photo reactive material after image transferring of Image area 2 of Example #10 of Table 1.

FIG. 9b3: FIG. 9b3 depicts a microscopic picture of marks left on the photo reactive material after image transferring of Image area 3 of Example #10 of Table 1.

FIG. 9b4: FIG. 9b4 depicts a microscopic picture of marks left on the photo reactive material after image transferring of Image area 4 of Example #10 of Table 1.

FIG. 9c1: FIG. 9c1 depicts a microscopic picture of marks left on the photo reactive material after image transferring of Imaging area of Example #12 of Table 1.

FIG. 9c2: FIG. 9c2 depicts a microscopic picture of marks left on the photo reactive material after image transferring of Edge between imaging and non-imaging areas of Example #12 of Table 1.

FIG. 10 illustrates generation of 3D/flip effects in 2-dimensional angles (α, β) with the 3D/flip film/paper with hemi-spherical or spherical lens layer illustrated in the present invention. The angles could be (Fα, Lβ), (Bα, Lβ), and (Bα, Rβ) as desired. For example, (−20°,0°), (+25°,0°), (0°,−15°), (0°, +30°).

FIG. 11: FIG. 11 shows the art examples that were printed to test the linear lenticular lens photo-substrates of Ex. #1-8 in Table 1.

FIG. 12: FIG. 12 shows the art examples that were printed to test the hemi-spherical/spherical lenticular lens photo-substrates of Ex. #9-15 in Table 1.

DETAILED DESCRIPTION OF THE INVENTION

Figure 3A:
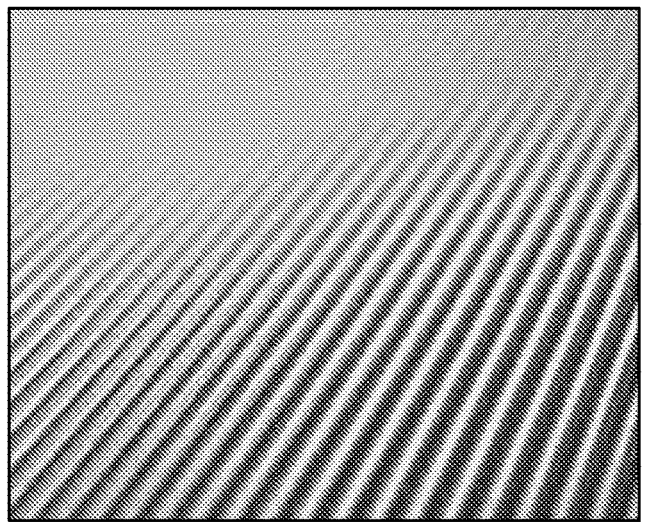

It is to be understood that the foregoing general description and the following detailed description are exemplary and explanatory only, and are not restrictive of any subject matter claimed.

Unless otherwise defined, all technical and scientific terms used herein have the same meaning as is commonly understood by one of skill in the art to which the inventions belong. All patents, patent applications, published applications and publications, websites and other published materials referred to throughout the entire disclosure herein, unless noted otherwise, are incorporated by reference in their entirety for any purpose.

The present invention provides a photo-substrate comprising a lenticular lens array. The present invention provides a method for in-situ production of lenticular images, by direct imaging using the photo-substrate of the present invention. The present invention provides the ability to add special variable images to packaging, for example, without resorting to complex registration and thick, molded plastic sheeting. The use of special 3D, flip, or motion effects in packaging design and printing have been limited to the size, thickness, complexity and cost of adding the digitally filtered composite images and thick plastic lens arrays. The present invention removes both of those barriers to adoption of 3D and motion effects to labels and packages.

Definitions

In this application, the use of the singular includes the plural unless specifically stated otherwise. As used herein, the singular forms "a," "an" and "the" are intended to include the plural forms as well, unless the context clearly indicates otherwise.

In this application, the use of "or" means "and/or" unless stated otherwise.

As used herein, the terms "comprises" and/or "comprising" specify the presence of the stated features, integers, steps, operations, elements, and/or components, but do not preclude the presence or addition of one or more other features, integers, steps, operations, elements, components, and/or groups thereof. Furthermore, to the extent that the terms "includes," "having," "has," "with," "composed," "comprised" or variants thereof are used in either the detailed description or the claims, such terms are intended to be inclusive in a manner similar to the term "comprising."

As used herein "article" or "articles" means a substrate or product of manufacture. Examples of articles include, but are not limited to: substrates such as paper, fabric, plastic, plastic or polymer film, glass, ceramic, metal, wood, composites, and the like; and products of manufacture such as publications (e.g. brochures), labels, and packaging materials (e.g. cardboard sheet or corrugated board), containers (e.g. bottles, cans), clothing, a polyolefin (e.g. polyethylene or polypropylene), a polyester (e.g. polyethylene terephthalate), a metalized foil (e.g. laminated aluminum foil), metalized polyester, a metal container, and the like.

As used herein, when referring to "light" it is to be understood that this includes all types of electromagnetic radiation, such as, for example, visible light, ultraviolet light, infrared light, x-rays, gamma-rays, and microwaves, unless specified otherwise. Similarly, the terms and phrases "energy-reactive," "energy-reacting." "photo-reacting," "photo-reactive," "light-reacting," "light-reactive," and similar terms and phrases, are used interchangeably and refer to any material that reacts to any type of electromagnetic radiation.

As used herein, the term "collimated light" refers to a beam of light with a low beam divergence so that the beam radius does not change significantly within moderate propagation distances. In certain embodiments, "collimated light" refers to multiple parallel light beams. Multiple parallel light beams may be produced, for example and not by way of limitation, by a collimating Fresnel lens.

As used herein, the term "image" includes, but is not limited to, pictures of objects, humans, animals, plants, etc., words, logos, and any shape or form that can be photographed and/or printed.

As used herein, the terms "photo-substrate," "photo-film," "3D photo-film," "3D/flip film/paper,", "3D/flip/motion effect film/paper", "3D/flip film,", "3D/flip/motion effect film," "3D film," "3D/parallax movie film," and similar phrases, are used interchangeably, and refer to the photo-substrate of the present invention as described below.

As used herein, ranges and amounts can be expressed as "about" a particular value or range. "About" is intended to also include the exact amount. Hence "about 5 percent" means "about 5 percent" and also "5 percent." "About" means within typical experimental error for the application or purpose intended.

Photo-Substrate

The photo-substrate of the present invention comprises a lenticular lens array, with a substrate comprising one or more layers of energy-reactive materials adhered to the backside of the lenticular lens array. Preferably, the energy-reactive material is adhered at the focus of the lenticular lens array. The lenticular image is directly printed on the one or more layers of energy-reactive material through the lenticular lens array, eliminating the problems with registration often encountered with prior art methods. Using the photo-substrate and methods of the present invention there is automatic registration of images and the lenticular lens array for creating a 3D, flip, or motion effect in a printed image.

Figure 3B:
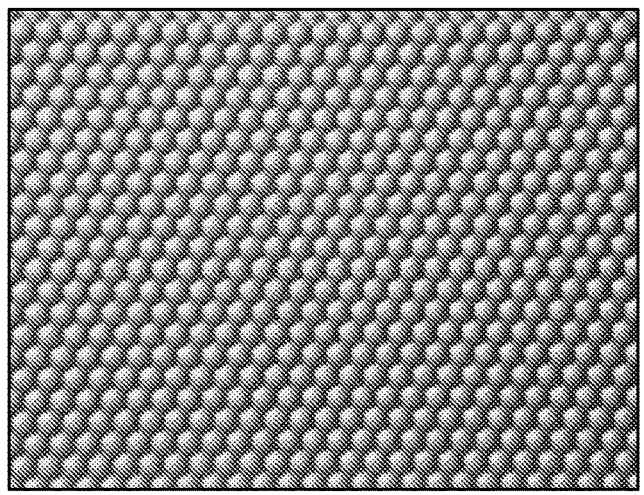
FIG. 3b.

The lenticular lens of the present invention may be of any configuration. Suitable types of lenticular lens arrays include, but are not limited to, linear, spherical, honeycomb, or square, and combinations thereof Different types of lenticular lens arrays are shown in FIG. 3. Because the imaging is done directly through the lenticular lens array, there is no need for complicated interlacing of printed images.

The thickness of the lenticular lens array of the present invention is preferably about 1 µm to about 10,000 µm. Thinner lenticular lens arrays allow for lenticular printing on a wider variety of substrates and articles, such as clothing or packaging. The lenticular lens array could be of a uniform thickness, or may be a combination of two or more thicknesses.

The lenticular lens array can be made of any suitable material. For example, the lenticular lens array can be made from glasses or polymers (plastics). Suitable glasses include, but are not limited to soda-lime, borosilicate, quartz, and the like. Suitable polymers include, but are not limited to, polycarbonate, polyolefin, polyurethane, polyvinyl-butyral, thermoplastic polyurethane, polydimethylsiloxane, poly (p-methylstyrene), poly(ethylene-vinyl acetate), and the like.

Figure 4:
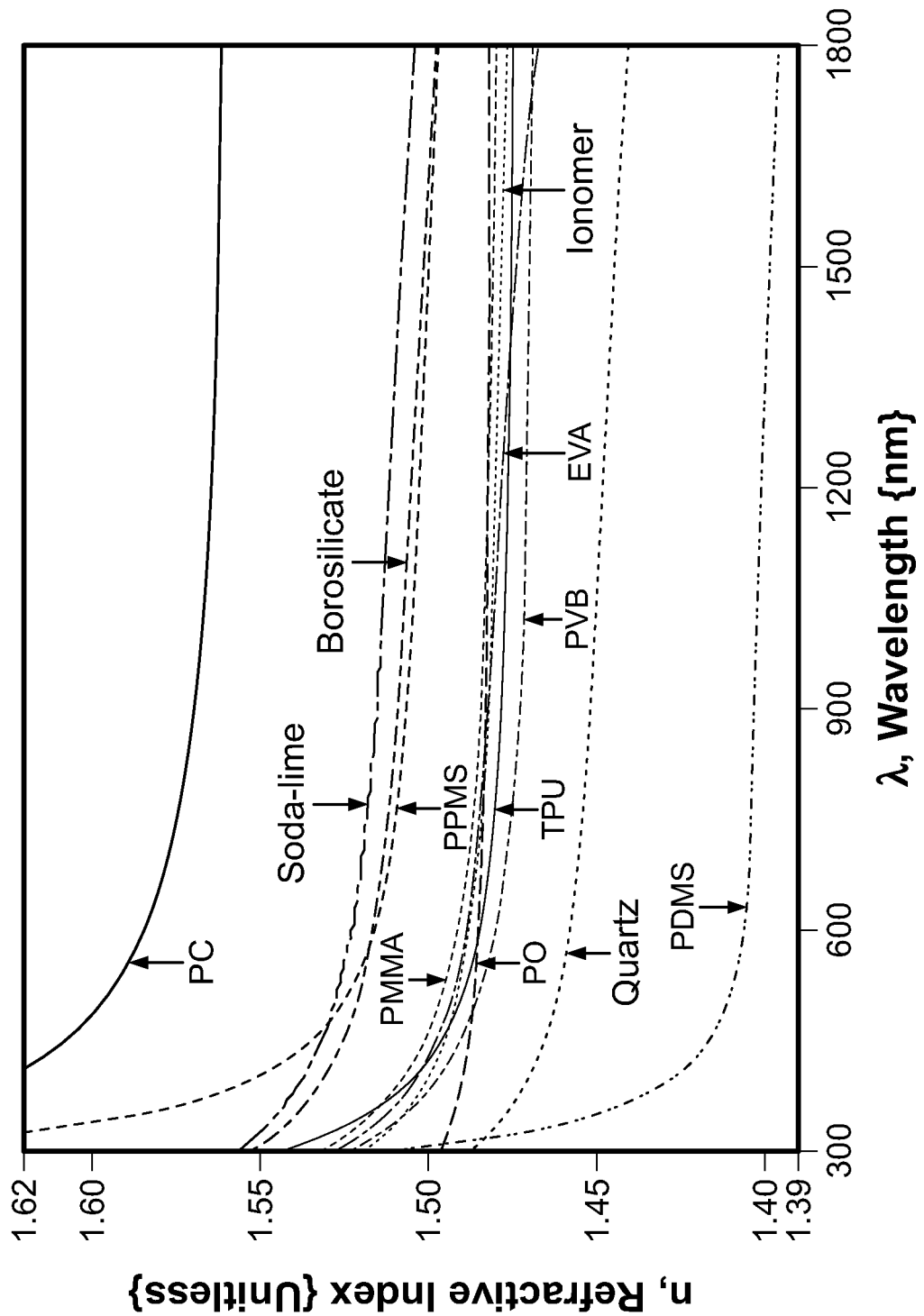
FIG. 4.

The refractive index of the material of the lenticular lens affects the thickness of the lenticular lens layer. The higher the refractive index of the lens material, the thinner the lens layer can be. FIG. 4 illustrates the refractive index of several suitable lenticular lens materials. We can see from FIG. 4 that the refractive indexes of glasses and polymers decreases with increasing wavelength of light and stays approximately the same in the range of light with a wavelength of about 0.6 to about 1.8 µm. The lenticular lens material's refractive index preferably stays the same over the wavelength fit for the photo-reacting material of 3D film/paper to change colors and visible light wavelength. The stable refractive index minimizes the chromatic aberration difference during the image recording and the image projection afterwards. Preferably, the refractive index of the lenticular lens is about 1.35 to about 1.75.

The lenticular lens array can be produced by thermoforming, cold forming, mold forming, embossing, laser-cutting, machine-cutting, printing, or combinations thereof. For example, the lenticular lens array may be formed by lithography, or indirect-image transferring.

The substrate comprising the energy-reactive material is not limited, and can be, for example, paper, plastic, flexible film, fabric, metal, ceramic, or 3D/parallax movie film. The substrate may be available as a product already comprising the energy-reactive material. Suitable substrates comprising energy-reactive material include, but are not limited to, Kodak Ultramax 400 (reactive to visible light), Polaroid Zink paper (reactive to non-visible light), Zap-it Alignment paper (reactive to laser light), or FujiChrome Astia100F Professional (color reversal film). The substrate may alternatively be naked (i.e. not coated with an energy-reactive material) and subsequently coated with an energy-reactive material appropriate for the type of energy to be used prior to adhering the substrate to the lenticular lens array. For example, but not limited to, the substrate may be coated with a photo emulsion such as Rockland Liquid Light from Rockland Colloid, which is a silver gelatin photographic emulsion; color changing inks such as SPEL 2390 from Sun Chemical, which is a proprietary flexographic white ink that provides a visible color change from white to black when subjected to the energy of a laser; dichromated gelatin (DCG); or polyvinyl carbazole; and the like.

In an alternative embodiment, the lenticular lens array is formed by coating the substrate with a monolayer of nano- or micro-glass beads. The glass beads are the individual lenticular lenses in the lenticular lens array.

The energy-reactive material can be of any type reactive to electromagnetic radiation. The photo-reactive material should be able to react to visible or non-visible light at a proper intensity and capture the color of the image accordingly. Ideally, the photo-reacting material could record precisely the colors in the collimated light sent in by the projectors, and is of a high enough resolution for capturing detailed images, such as less than 1 µm, preferably less than 100 nm, and more preferably less than 10 nm. For example, the energy-reactive material may be reactive to visible light, ultraviolet (UV) light, infrared light, x-rays, gamma-rays, or microwaves. Suitable energy-reactive materials include, but are not limited to, silver emulsions based on silver salts, silver halides, or coatings comprising photo-sensitive dyes. Photo-sensitive dyes include leuco dyes, which change color upon exposure to various wavelengths of electromagnetic radiation. Photo-sensitive dyes include, but are not limited to, ruthenium-based dyes, potassium ferricyanide, ferric ammonium citrate, potassium dichromate, rhodamine type dyes (e.g. tetraethyl rhodamine (Rhodamine B)), sodium p-dimethylamine-azobenzenesulfonate (methyl orange), 3,7-bis(dimethylamino)phenazathionium chloride (methylene blue), ammonium dichromate, pyridine dichromate, fluoresceins and halogenated derivatives thereof (e.g. tetraiodofluorescein, tetrabromofluorescien, diiodoeosine, tetrabromodhchlorofluorescein), cyanines (e.g. 1,1'-diethyl-4, 4'-cyanine iodide (cyanine blue); 1,1'-diethyl-2,4-cyanine iodide (ethyl red); 1,1'-diethyl-2,2'-carbocyanine iodide (pinacyanol); 1,1'-diethyl-4,4'-carbocyanine iodide (Kryptocyanine)), combinations thereof, and the like.

When two or more layers of energy reactive material are used they may be reactive to the same wavelength, or different wavelengths. For example, the photo-substrate may comprise one layer of energy-reactive material reactive to red light, one layer of energy-reactive material reactive to green light, and one layer of energy-reactive material reactive to blue light.

The photo-substrate of the present invention can be in any form appropriate for the intended use. For example, the photo-substrate may be in the form of sheets, plates, or continuous web. A continuous web photo-substrate may be suitable for flatbed printing, or roll-to-roll printing. In certain embodiments, the photo-substrate of the invention may be adhered to an article, such as a cup, package, clothing, or other object, so that a lenticular image can be directly formed on that object.

Method of In-Situ Lenticular Image Formation Using the Photo-Substrate

The method of the present invention eliminates the need for interlacing of multiple images, and of subsequent laborious registration of a lenticular lens array over the printed, interlaced images. This is because, using the photo-substrate of the present invention, the image is printed directly through the lenticular lens array. The images are automatically interlaced and registered in the energy-reactive material at the backside of the lenticular lens array.

The various image slices are produced directly by exposing the energy-reactive material with narrowly collimated energy/light/laser beams at different angles that correspond to the subsequent viewing geometry. The narrowly collimated energy/light/laser beams mirror the narrowly focused human eye. The first image can be printed, then the substrate rotated through a small angle and the second image printed, and so on for each subsequent layer of the lenticular image.

The collimated light carrying images go through the lens layer with unit lenses in a cylindrical, hemispherical, or spherical, or random shapes, wherein the unit lenses can be in an ordered array (e.g. linear) or random array. The light will be bent by the lens layer, and form ordered or random patterns according to the unit lens and the lens structure. The patterns are recorded by the light reacting material directly below the lens layer. The locations of patterns and the patterns are different with different angles of incidence of collimated light on the photo-substrate.

When viewing the printed image, the light carrying the ordered or random patterns go through the same lens layer and form the original image only if the angle of observation is equal to the original angle of incidence used during recording. FIGS. 2a to 2c show the printing and subsequent viewing of the lenticular image.

Thus, different images can be recorded at different angles of incidence and shown back at corresponding angles of observation equal to the angles of incidence. This result flows from application of the Helmholtz law of reciprocity. According to the Helmholtz law of reciprocity, a ray of light and its reverse ray encounter matched optical phenomena, such as reflections, refractions, and absorptions in a passive medium or at an interface. Essentially, incoming and outgoing light can be considered as reversals of each other. Thus, the image that is produced at a particular angle is shown back to the viewer at the same angle in reverse. FIGS. 2a to 2c show how this works with the photo-substrate of the present invention.

In addition to exposing the energy-reactive material at different angles, the light beam could penetrate to different depths, depending on the wavelength of the light source for example. Multiple layers of energy-reactive material could be used, which could be reactive to different types of energy, producing different colors. The color of the subsequent image would correspond to the wavelength of the light and reactivity of the particular layer at a specific angle. In this way, the colors of the original image could be reproduced accurately.

Any suitable source of energy can be used, depending on the intended image. Preferably, the energy is collimated, to produce precise irradiation of the energy-reactive material. Preferably, the energy-reactive material is reactive to visible light. Chromatic aberration may occur when IR light, or any wave with a wavelength larger than that of visible light, or UV or x-ray light, or any wave with wavelength less than that of visible light, is used in image recording. Digital and optical techniques could be used for correcting and aligning the focal plane to the photo-reacting material pixel by pixel as needed. Visible light can be generated from any suitable light source, for example laser, or Digital Light Processing (DLP) projectors.

In one embodiment, images can be formed by propagating laser radiations directly through the lens and onto the energy-reactive backing material using an RGB laser. Similarly, the images can be projected in collimated light incident to the lenticular photo-substrate at angles by using a front projection system, and transferred directly to the photo-reacting material plane. Such a projection image, recorded through the lenticular lens array, will produce a pseudo-3D appearance, and/or flip or motion effects.

The image and/or words and/or logos, and the like, could be projected using laser or color visible light, or UV light, according to the photo-reacting material on the photo-film for image recording. Table A gives examples of different lasers that could be used for imaging purposes. Images can be formed by propagating laser radiations directly through the lens and onto the backing film using an RGB laser. Preferably, the photo-reacting materials could change color according to different lasers used, or exposure time of the same laser, or the combination of both.

TABLE A

Examples of lasers

| | Laser | Wavelength |
|---|---|---|
| Ultraviolet | $F_2$ excimer | 157 nm |
| | ArF excimer | 193 nm |
| | [a], [b]Nd:YAG (5$^{th}$ harmonic) | 213 nm |
| | He—Ag$^+$ | 224.3 nm |
| | KrCl excimer | 222 nm |
| | Nd:YAG (4$^{th}$ harmonic) | 266 nm |
| | XeCl excimer | 308 nm |
| | He—Cd | 325 nm |
| | Nitrogen | 337.1 nm |
| | Ne$^+$ | 332.4 nm |
| | XeF excimer | 351 nm |
| | Ruby (doubled) | 347 nm |
| | Nd:YAG (tripled) | 355 nm |
| | Ar$^+$ | 351 nm |
| | Ti:sapphire (tripled) | 235-330 nm |
| | He—Au$^+$ | 282-292 nm |
| | Ne—Cu$^+$ | 248-270 nm |
| | Dyes (doubled) | 0.2-0.4 μm |
| Ultraviolet ~ Visible | Alexandrite (doubled) | 360-400 nm |
| | InGaN | 370-493 nm |
| | Ti:sapphire (doubled) | 360-460 nm |
| Visible | He—Cd | 441.6 nm |
| | Ar$^+$ | 488 nm |
| | Copper vapor | 510.5 nm |
| | Copper vapor | 578.2 nm |
| | Nd:YAG (doubled) | 532 nm |
| | He—Ne | 543.5 nm |
| | Xe$^{3+}$ | 539.5 nm |
| | He—Ne | 594.1 nm |
| | He—Ne | 611.9 nm |
| | He—Ne | 632.8 nm |
| | Gold vapor | 628 nm |
| | Kr$^+$ | 647.1 nm |
| | Ruby | 694.3 nm |
| | GaN | 515-520 nm |
| | Dyes in polymer | 550-700 nm |
| | Dyes | 0.38-1.0 μm |
| | InGaAlP | 630-685 nm |
| Visible ~ Near-infrared | Cr-fluoride | 780-850 nm |
| | Alexandrite | 700-800 nm |
| | GaAlAs | 750-850 nm |
| | Ti:sapphire | 670-1130 nm |
| | Dyes | 0.38-1.0 μm |
| Near-infrared | Nd:YAG | 946 nm |
| | Nd:YAG | 1064 nm |
| | [c], [d]Other hosts | 1047-1079 nm |
| | He—Ne | 1152 nm |
| | Iodine | 1315 nm |
| | Nd:YAG | 1319 nm |
| | He—Ne | 1523 nm |
| | Er:glass | 1.54 μm |
| | Tm:YAG | 2.01 μm |
| | Ho:YAG | 2.08 μm |
| | Er:YSGG | 2.79 μm |
| | Er:YAG | 2.90 and 2.94 μm |
| | InGaAs | 1.27-1.33 μm |
| | InGaAs | 1.43-1.57 μm |
| | Fosterite | 1.13-1.36 μm |
| | HF chemical | 2.6-3.0 nm |
| | AlGaIn/AsSb | 1.87-2.2 μm |
| Near-infrared ~ Mid-infrared | Dyes (Raman shifted) | 0.9-4.5 μm |
| | Xe—He | 2-4 μm |
| Mid-infrared | He—Ne | 3.391 μm |
| | $CO_2$ | 10.6 μm |
| | $CO_2$ (doubled) | 4.6-5.8 μm |
| | CO | 5-7 μm |
| | DF chemical | 3.6-4.0 μm |
| | Pb salts | 3.3-27 μm |
| | $CO_2$ | 9.2-11.4 μm |
| Far-infrared | Methanol | 37.9 μm |
| | Methanol | 70.5 μm |
| | Methanol | 96.5 μm |
| | Methanol | 118 μm |
| | Methylamine | 147.8 μm |
| | Methyl fluoride | 496 μm |
| | Methanol | 571 μm |
| | Methanol | 699 μm |

[a] "YAG" is an yttrium aluminum garnet ($Y_3Al_5O_{12}$) laser host crystal.
[b] "Nd:YAG" is a neodymium-doped YAG crystal.
[c] Other laser host crystals include, but are not limited to, $Gd_3Ga_5O_{12}$ (GGG), $Gd_3Sc_2Al_3O_{12}$ (GSGG), $YAlO_3$ (YALO), $YVO_4$ (yttrium vanadate), $GdVO_4$, $YLiF_4$ (YLF), $KGd(WO_4)_2$ (KGW), $KY(WO_4)_2$ (KYW), $KLu(WO_4)_2$ (KLuW), $Sr_3Y(BO_3)_3$ (BOYS), $GdCa_4O(BO_3)_3$ (GdCOB), $SrY_4(SiO_4)_3$ (SYS), $Y_2O_3$, $Sc_2O_3$, $LiCaAlF_6$ (LiCAF), $LiLuF_4$ (LiLuF), $LiSrAlF_6$ (LiSAF), sapphire, ZnS, ZnSe, $ZnS_xSe_{1-x}$, $Al_2O_3$ (ruby), $LiSrGaF_6$ (LiSGAF), $MgSiO_4$ (forsterite), $NaGd(WO_4)_2$ (NGW), $NaY(WO_4)_2$ (NYW). For a description of laser host crystals see "Section 1: Crystalline Materials," *Handbook of Optical Materials*, M. J. Weber ed., CRC Press 2003.
[d] Dopants for laser host crystals include, but are not limited to, neodymium, ytterbium, erbium, thulium, holmium, cerium, titanium, chromium (II), chromium (III), chromium (IV).

FIG. 2a illustrates the ideal situation of light channels or routes for forming the images on the photo-reacting materials, and the images projected back in the visible light environment afterwards. The collimated light carrying images go through the lens layer with unit lens in cylindrical or hemi-spherical or spherical, or random shapes, and with these unit lens in ordered (such as linear lenticular lens) or random structures; the light will be bent by this lens layer and form ordered or random patterns according to the unit lens and the lens structure. These patterns are recorded by the light reacting material directly below the lens layer. The locations of patterns and the patterns are different with different angles of incidence of collimated light on the 3D/flip film. Afterwards, in the reverse direction, the light carrying the ordered or random patterns go through the same lens layer and form the original image information only if the angle of observation is equal to the original angle of incidence used during recording. In this way, different images could be recorded at different angles of incidence, and shown back at corresponding angles of observation equal to the angles of incidence.

Preferably, the light used in image projection by the projectors is the same as the visible light range for eyes to function in. More preferably, the color in each pixel of the images formed on the light-reacting material would be the same as the color in each pixel of the original images 1, 2, 3, etc. used, as shown in FIG. 1a. In this case there is no chromatic aberration (the lens refracts/bends higher wavelength light more than lower wavelength light, such as blue vs. red), and the channels in FIG. 2a1 for forming the images on the light-reacting material are exactly the same as the channels in FIG. 2a2. The bigger the difference between the wavelength of light used for forming the images, and the wavelength of visible light, the less perfect the images for the eyes actually are.

Preferably, exposure of all the lenticular 3D photo-film is carried out in a dark room, or a dark space, to avoid the light contamination from the surrounding environment. But, if the photo-reacting material on the lenticular 3D film is only reacting to light/laser which is much stronger in intensity, for example by 2 orders of magnitude stronger, then ambient environment could be used for production.

Other pre-patterned layers could be incorporated before exposure into the lenticular 3D photo-film to show special effects, either in between the lenticular lens and photo-reacting material or contacting only the photo-reacting material on the back. For example, Grapac Japan used star/dot/mesh/heart/zebra lines/square patterns and honeycomb/ square spherical lens array to achieve different depth effects. These special effects could provide another dimension to the eyes for the final product.

Method of High Volume/Industrial In-Situ Lenticular Image Formation

The present invention provides the ability to add special variable images to packaging without resorting to complex registration and thick, molded plastic sheeting. The use of special 3D and flipping or motion effects in packaging design and printing have been limited to the size, thickness, complexity, and cost of adding the digitally filtered composite images and thick plastic lens arrays. The present invention removes these barriers to adoption of 3D and motion effects to labels and packages.

Figure 6A:
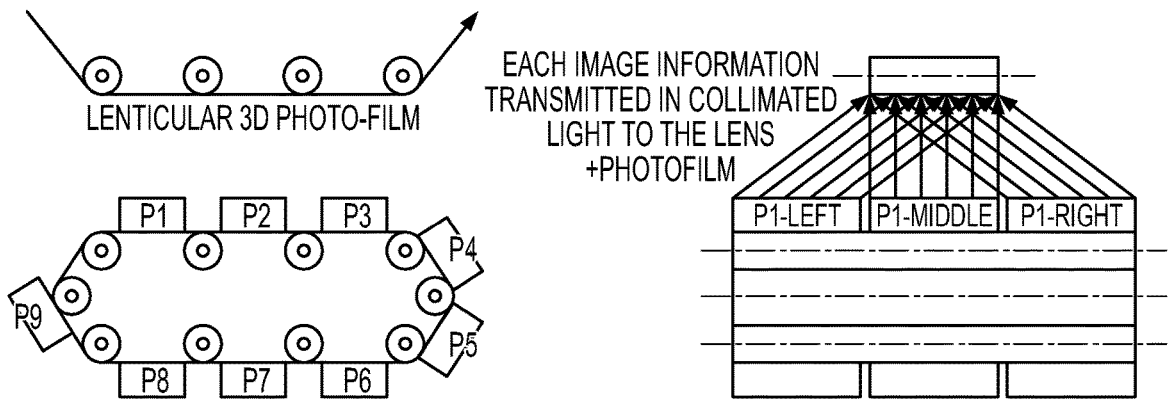
Figure 6B:
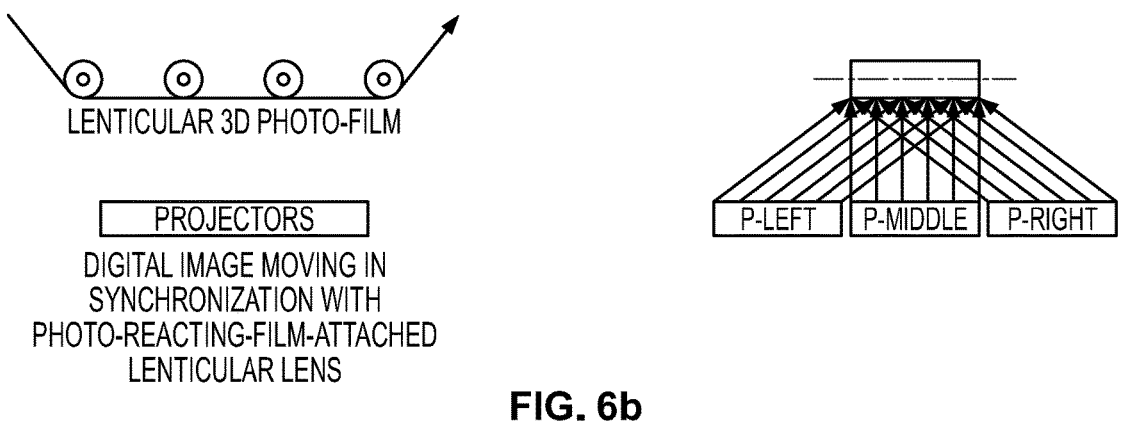
FIG. 6b.
Figure 6C:
FIG. 6c.

The present process is for directly producing 3D and/or flip and/or moving effects(s) using energy-reacting film at the focal plane of a lenticular lens array, with a technique fit for in-situ image change and/or large-scale production such as roll-to-roll. Some examples are shown in FIGS. 6a to 6c. The special effect picture/image can be produced at or near to the end of the press run. Current lenticular printing requires the addition of a physically thick plastic sheet over the composite image in a complex post-press converting step. Unlike most converting steps, the alignment of the plastic sheet over the composite image requires very precise alignment, much like the registration of printing stations, yet most post-printing converting stations do not include equipment for holding tight tolerances on added materials. The method of the present invention eliminates those requirements. Thus, with this novel approach to lenticular printing, it is both feasible and cost-effective to add special effects to consumer packaging.

The lenticular 3D film is composed of a lenticular lens array and photo-reacting materials mounted at the focus of the lenticular lens array. Images can be formed by propagating laser radiations directly through the lens and onto the backing film using an RGB laser. Similarly, the image can be transferred directly to the film plane using a front projection system, projecting the image from different angles of incidence. Such a projection image, recorded through the lenticular array, will produce a pseudo-3D appearance or a flip/moving effect.

The present invention discloses a process of directly forming images of 3-dimensional and/or flip and/or motion effects with multiple 2D images, by direct recording onto the lenticular 3D photo-film through the lenticular lens array. The lenticular 3D photo-film is composed of a lenticular lens array and photo-reacting material(s) mounted at the focus of the lenticular lens array. Images can be formed by propagating laser radiations directly through the lens and onto the backing film using an RGB laser. Similarly, the images can be projected in collimated light incident to the lenticular 3D photo-film at different angles by using a Digital Light Processing (DLP) front projection system and transferred directly to the photo-reacting material plane.

A DLP front projector operates by focusing light from a point source (e.g. a lamp) through a lens to form an image on a surface. A lens is characterized by its focal length. The focal length of a lens is the distance at which the lens focuses a point (i.e. light rays converge) at an infinite distance. The aperture of the lens is the "hole" or "pupil" through which light passes. The size of the aperture of a lens determines how much light will pass through. The smaller the size of the aperture, the less light that passes through. Collimated light can be projected by the DLP projector by using a projection lens with a high f/#. The f/# is the ratio of the focal length of the lens to the diameter of the aperture of the lens exit pupil. In this way, the DLP projector projects a narrowly focused beam of light, wherein the radius of the beam does not change significantly over the projection distance to the photo-substrate. Thus, lenses with a relatively long focal length having a small aperture will project collimated light onto the photo-substrate.

Alternatively, light from a DLP projector could be collimated by using a collimating lens. Collimating lenses make the light entering the lens, such as the diverging light from a point source, into parallel light beams. Each collimated light beam would print an image on the photo-substrate. For example, a Fresnel lens with the grooves facing out (away from the point source and toward the surface) would collimate the light from the point source.

Such a projection image, recorded through the lenticular array, will produce a pseudo-3D appearance and/or flip and/or motion effect(s). The image projector system could project different images in collimated light at different angles to the lenticular 3D photo-film at the same time or different times. A roll-to-roll continuous film production of the same pictures or different pictures, depending on the images fed into the image projector system, can be obtained. In the present invention, "image" also includes "word," for example "A" or "dog" could be considered as an image; "image" also includes "logo."

FIG. 6a gives an example of a setup involved in a roll-to-roll production. The photo-film is loaded on a roller train (mechanical rollers) and is moving. A Digital Light Processing (DLP) projection system is projecting images at the photo-film at a speed synchronized to the photo-film movement. For a system comprising a set of projectors, different images could be sent to the different projectors at the same time. For maximum production speed, the speed of the photo-film rolling is defined by the exposure time required for the photo-film to reach an optimized image over the length between the end rollers.

Alternatively, the DLP projection system and its sophisticated high f/# imaging system could be replaced by a series of lasers (e.g. Red, Green, Blue) each producing the very narrow and well collimated beams and then scanned and modulated back and forth across the film web as it is moved by. The high intensity of the laser beams provides consistent imaging of the film plane, and the RGB colors correspond to the sensitive dye layers in the film, producing a full color image along each direction. While many kinds of lasers could be used for this, a preferred embodiment would be the use of very small, solid state or diode lasers. Such small diode lasers are often found in presentation pointers and possess wavelengths such as 650 nm (red), 530 nm (green), 450 nm (blue), and 405 nm (violet).

FIG. 6b gives another example of a setup involved in a roll-to-roll production. The photo-film is moving, a DLP image projection system is projecting images at the photo-film at a speed synchronized to the photo-film movement. For maximum production speed, the speed of photo-film rolling is defined by the exposure time required for the photo-film to reach an optimized image over the length between the end two rollers.

FIG. 6c shows another example of a setup for 3D/flip/motion picture(s) in large format, for example, 6 feet (length) by 3 feet (width) for a human body, using projectors transmitting images in collimated light, for example 6 inch by 6 inch frames. The projectors are mounted on a stage powered by X-Y 2D step motors. The images could be produced by stationary exposing frame by frame. After one frame of area is exposed, the projectors will be dragged to the next frame, until the whole 6 ft. by 6 ft. picture is finished. In case one piece of lenticular 3D photo-film is not enough, it is preferred another piece is taped before the production instead of after.

FIGS. 6a to 6c only serve the purpose of showing a few examples of production processes with projectors and lenticular 3D photo-film positioned relative to each other. In real production, one or more projectors could be used; one or more of incident angles of the collimated light onto the lenticular 3D photo-film could be used. All the synchronized projectors in a set of projectors in a projection system are independent from each other. That means that different pictures or images could be sent to the individual projector at the same time or the same projector at different times, depending on the required production and final effects desired. Two or more projectors could be used in each projection system. Or a projector which can project two or more images at different angles relative to the photo-film plane could be used. Or, a projector which can project two or more images at different times and be positioned by a method such as by a mechanical rotator to let the collimated light irradiate the photo-film at a different angle at each different time, could be used. The images could be fed digitally or in analog into the projectors, and could be done either wirelessly directly from the customers, or using hard wires attached to a controller computer.

Apparatus for Producing a Photograph as a Lenticular Image

The present invention provides lenticular 3D photo-film/paper, and a camera designed for taking photographs having a 3D, flipping, or motion effect. Photos are taken at different angles using the camera with 3D film installed. The present 3D film and camera makes this 3D/flipping/motion-effect lens technology easy and accessible to everyone.

Figure 5A:
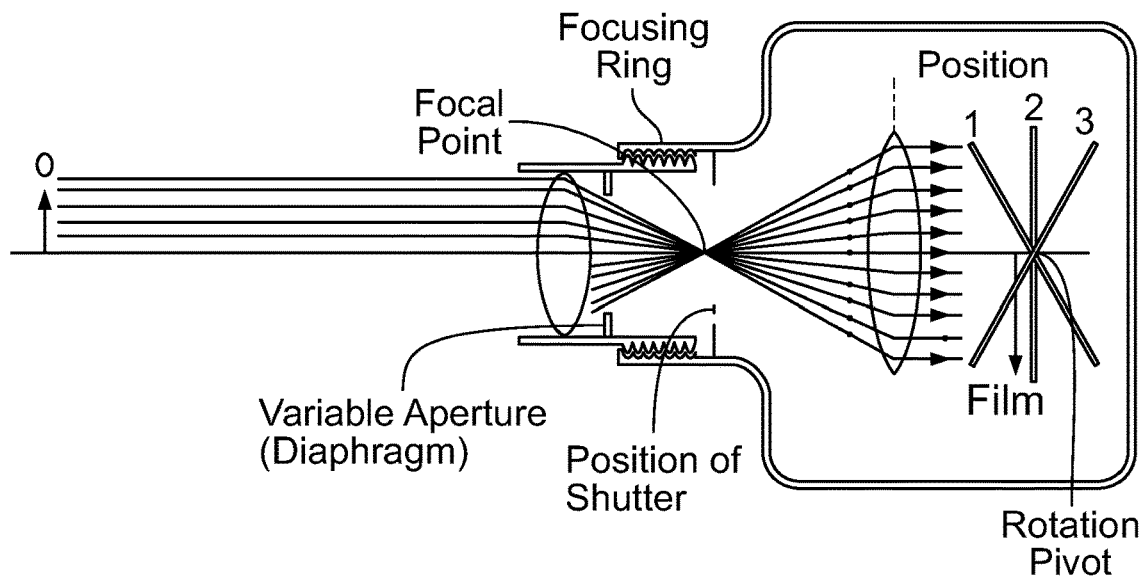
Figure 5B:
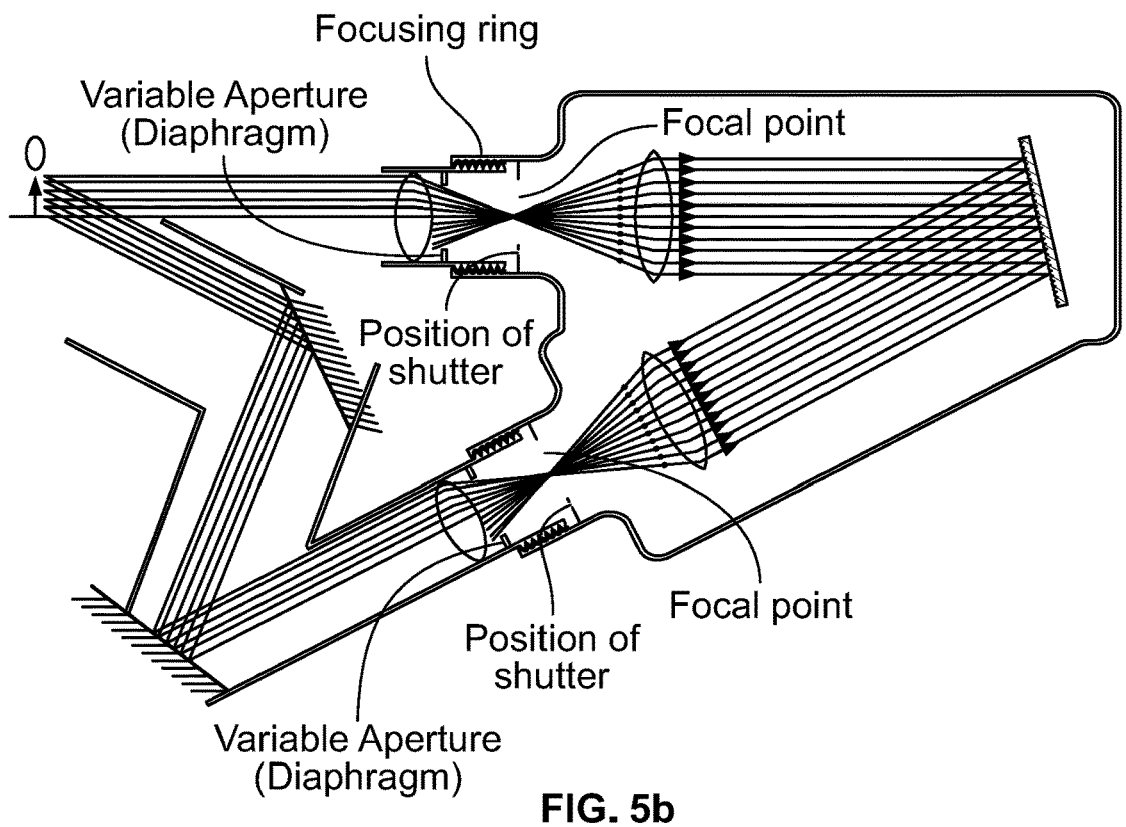
FIG. 5b.

FIGS. 5a and 5b give two example cameras for forming images at different angles. A camera example for the 3D photo-film, as shown in FIG. 5a, is different from the single lens designs in the traditional film or digital camera. The optical system could collimate the incoming light before the light reaches the film. The film is composed of a lenticular lens array and photo-reacting material placed at the focal plane of the lenticular lens. The lenticular 3D photo-film could rotate from a pivot supporting point or pivot line, depending on the final 3D/flip/moving effect desired. To achieve a 3D parallax effect, such as a human face for example, the camera would need to be focused on two of the same points on the face for pictures at each of two or more angles (which are called spot area), with the face staying still for each picture. The optics for flipping/moving effects are somewhat simpler, without the need to focus the same points for any 2 pictures. For example, the left eye and the right eye (a gap of 2.5 inches between the two eyes for example) try to focus on a human face at a distance of 2 feet away. The angle of difference for these two eyes in observation of the face is equal to arc sin (2.5/24)=5.98°. The camera could be moved around the face at intervals of 5.98° while the 3D film is rotated around the pivot at intervals of 5.98° simultaneously to take several pictures. These pictures taken at different angles are recorded in-situ through the lens layer onto the photo-reacting material. When the 3D film/paper is taken out of the camera, the 3D face is able to be observed on the 3D/flip film immediately after development. This could also be achieved in one shot using a second example camera with synchronized shutters, as shown in FIG. 5b. The two sub-cameras, focusing on the same item at two different viewing angles, are designed to feed the two image channels, and the angle difference could be adjusted by maneuvering the mirror/lens system and incident angles of light on the 3D/flip film.

A third example of a camera for a 3D photo-film/paper is for use with a 3D photo-film/paper that reacts to IR laser light, with a wavelength of about 0.71 μm to 1000 μm, outside the range of visible light (i.e. 0.39 μm to 0.71 μm). Through a light conversion system, the incoming visible light could be converted to IR laser with: i) the same or different wavelengths; and/or ii) the same or different intensities; and/or iii) the same or different exposure times, pixel by pixel in one direction relative to the 3D film/paper. The pixel-by-pixel laser triggers the photo-reacting material on the back-side of the 3D film/paper to react and form color pixels, preferably the same as the incoming visible light color in the corresponding pixel.

A fourth example of a camera for a 3D photo-film/paper is for use with a 3D photo-film/paper that reacts to UV laser with a wavelength of about 0.01 μm to about 0.39 μm, outside the range of visible light. Through a light conversion system, the incoming visible light could be converted to UV laser with: i) the same or different wavelengths; and/or ii) the same or different intensities; and/or iii) the same or different exposure times, pixel by pixel in one direction relative to the 3D film/paper. The pixel-by-pixel laser triggers the photo-reacting material on the back-side of the 3D film/paper to react and form color pixels, preferably the same as the incoming visible light color in the corresponding pixel.

A fifth type of camera is one which detects IR light, and is used with 3D photo-film/paper that is reactive to IR laser light having a wavelength about 0.71 μm to 1000 μm. The IR light enters the camera through a lens system for IR light. The incoming IR light could be transformed into one direction relative to the lenticular 3D photo-film/paper. The pixel-by-pixel IR light triggers the photo-reacting material on the back-side of the lenticular lens to react and form color pixels that show different levels of heat in the focused imaging area. For example, a person is usually warmer than surrounding objects (e.g. a tree), so a 3D IR heat image of the person can be obtained. Similarly, a 3D UV, 3D x-ray, 3D gamma-ray, or 3D microwave image could be generated and shown to the eyes.

Method of Producing a 3D/Parallax Movie

Figure 7A:
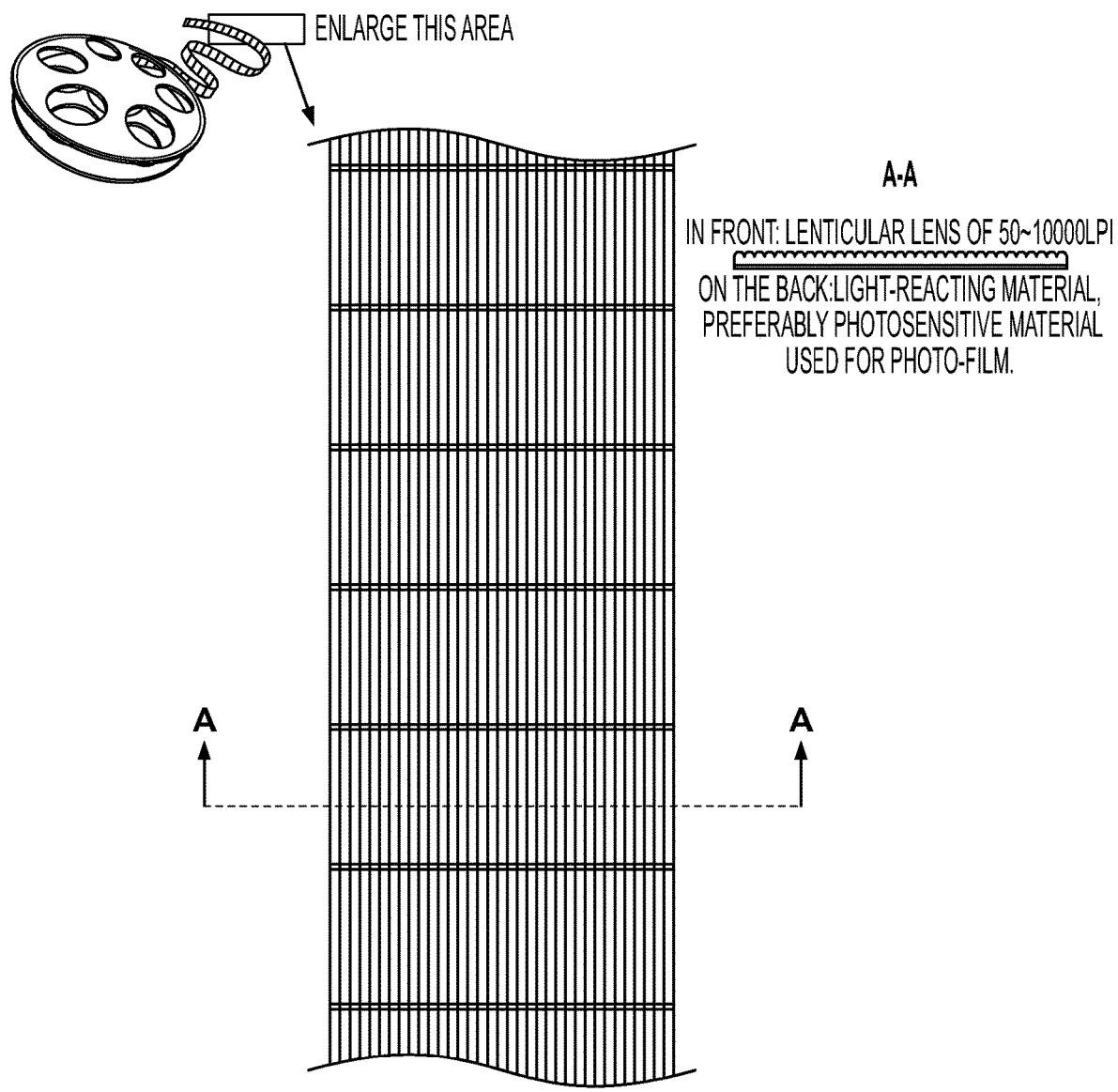
Figure 7B:
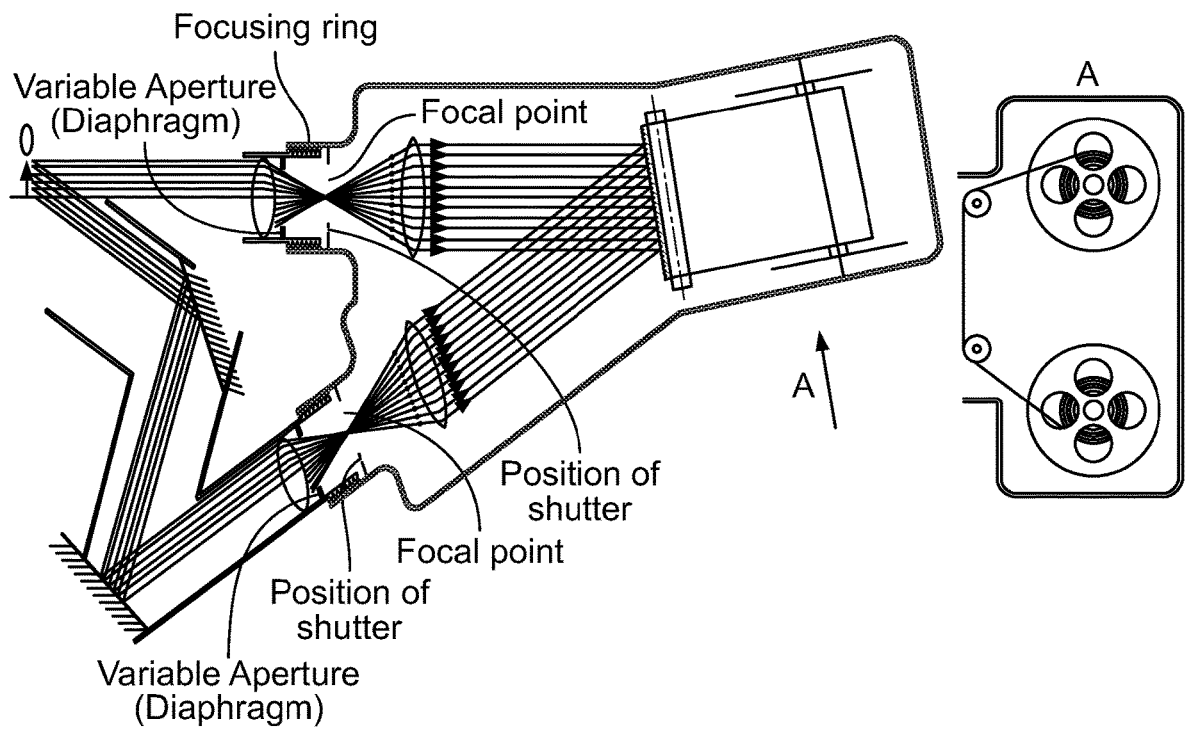
FIG. 7b.

FIG. 7a gives an example of 3D film roll for 3D/parallax movie production. The present invention could also be used to produce 3D movies by feeding the image-recording process described and illustrated in FIG. 7b with the traditional 3D movie film rolls filmed at different angles. After 3D movies are shot, you would feed the projector(s) in FIG. 7b at proper incident angles (for example, −3° and 3°) with the movie film rolls paired for the left eye and right eye onto the 3D film roll illustrated in FIG. 7a.

Figure 7C:
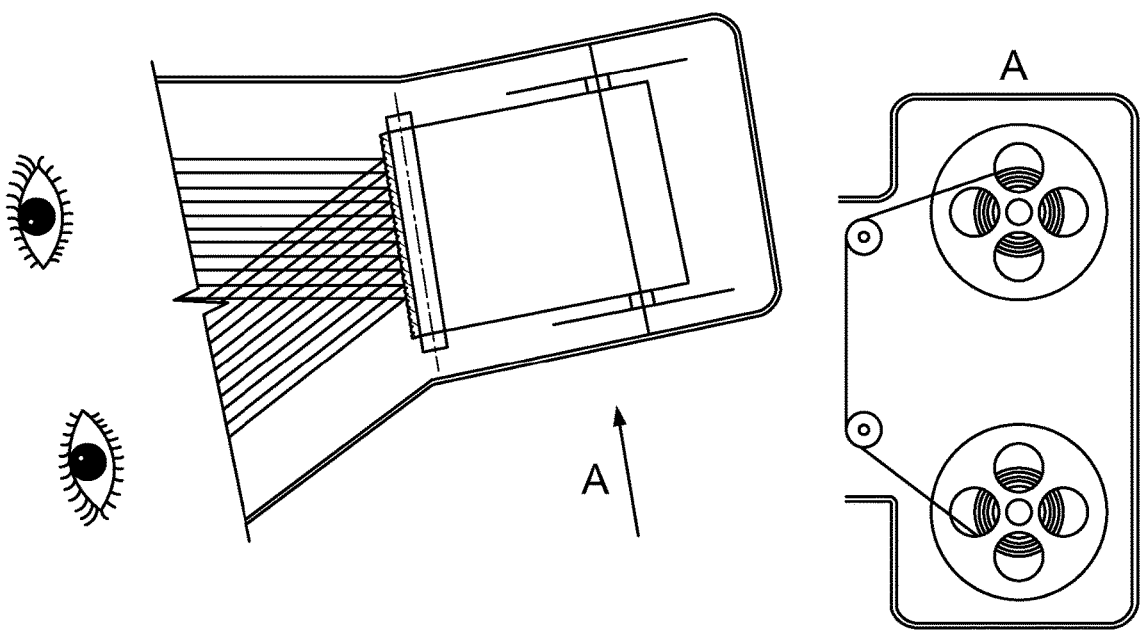
FIG. 7c.
Figure 8A:
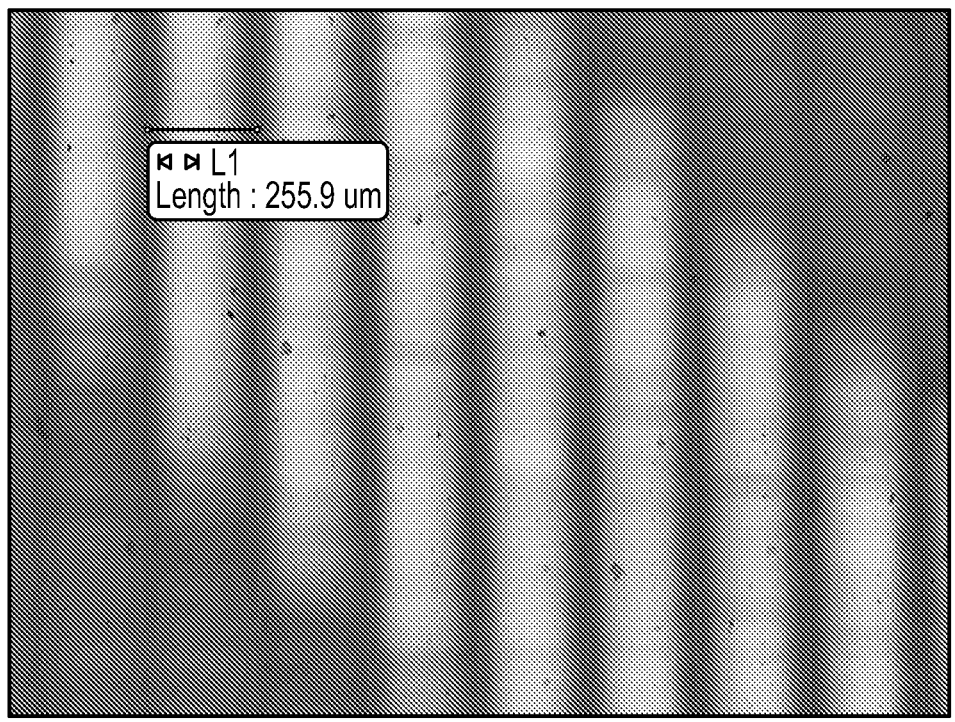
Figure 8B:
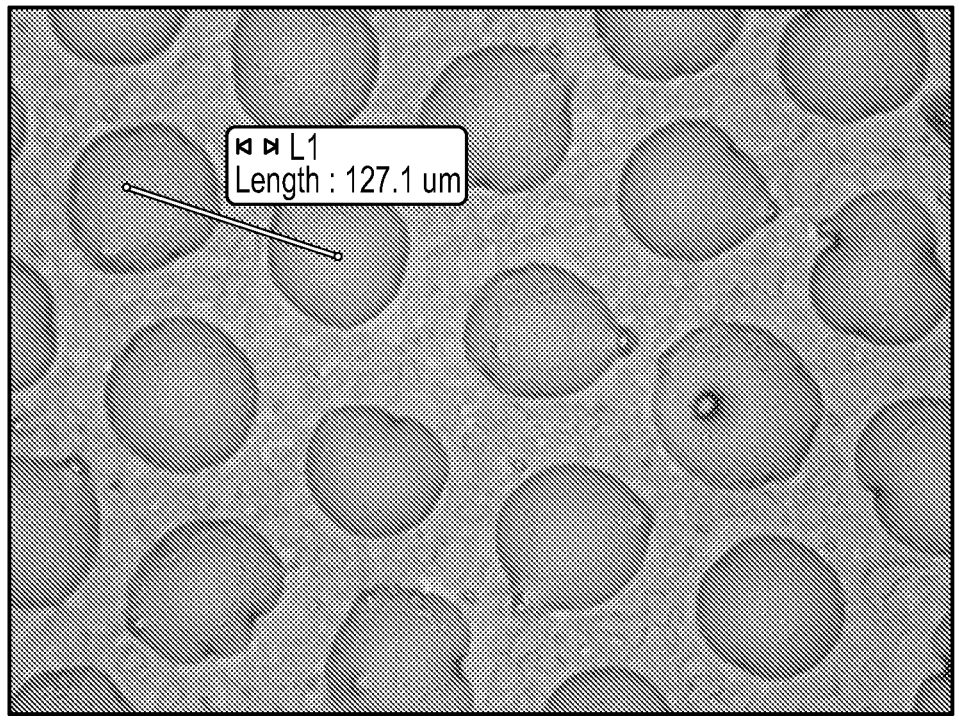
FIG. 8b.
Figure 8C:
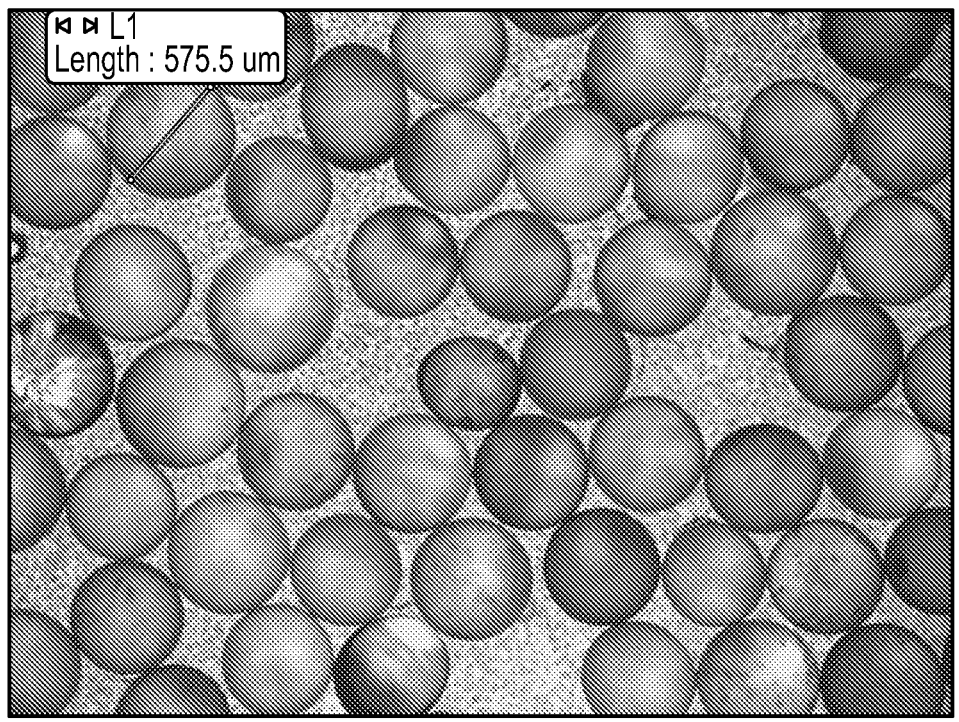
FIG. 8c.
Figure 8D:
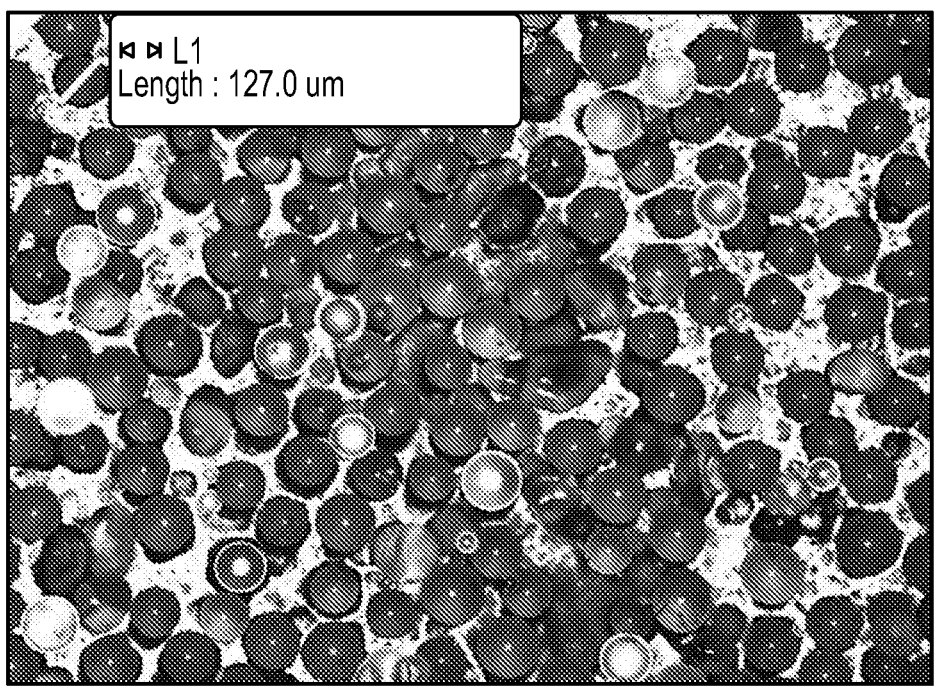
FIG. 8d.
Figure 8E:
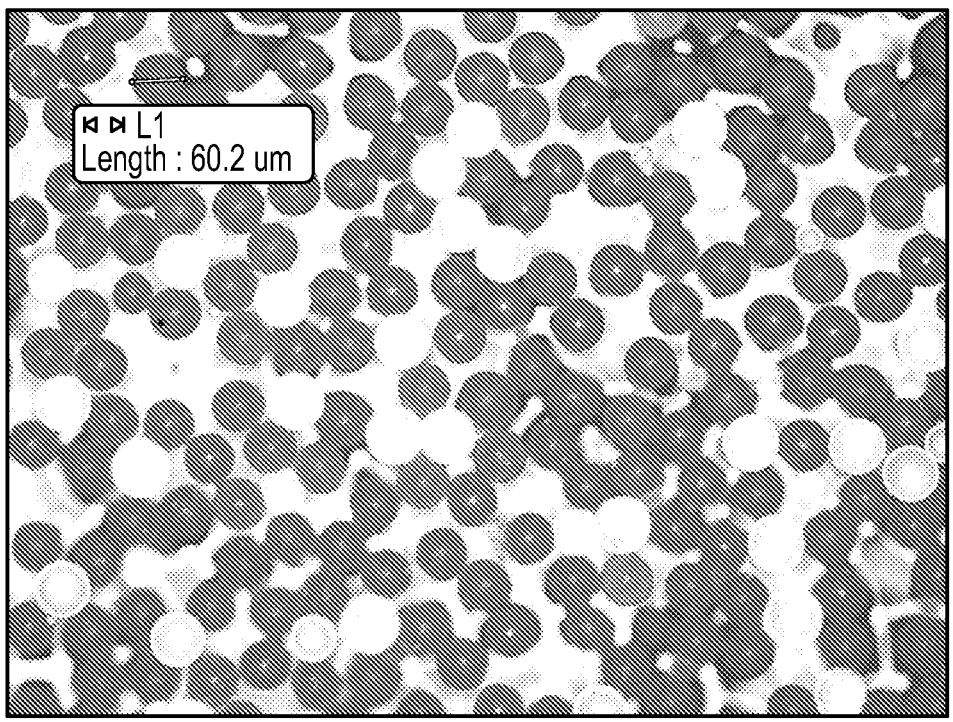
FIG. 8e.
Figure 8F:
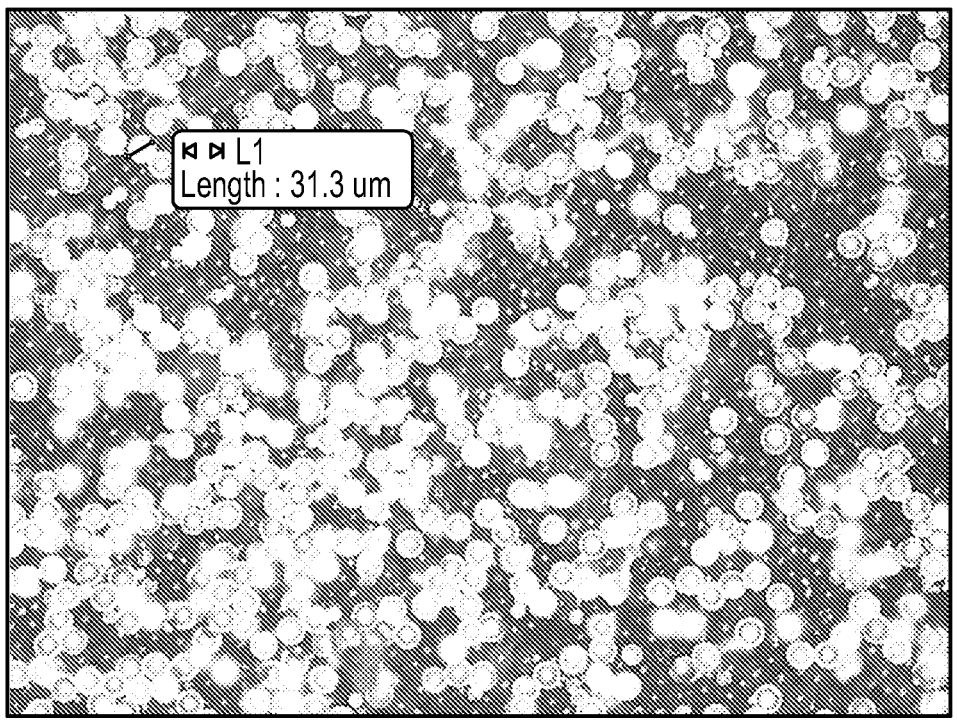
FIG. 8f.
Figure 10:
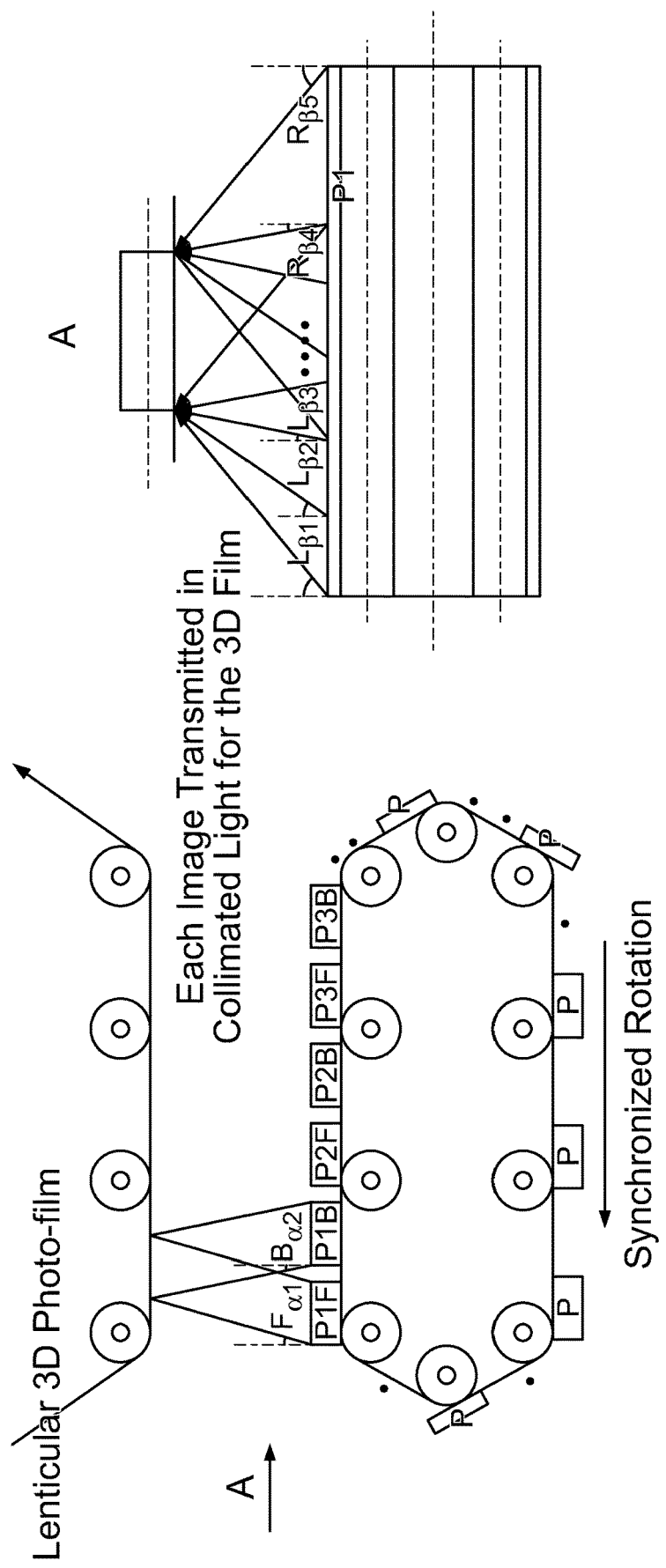
FIG. 10.

The 3D movie film generated as above can be played with an apparatus illustrated in FIG. 7c, preferably at the speed of 24 frames/second for people directly in front of the film, with the lens side facing the eyes at proper locations. Light received from the environment on the eyes side could be used by the image-recorded film to reflect some light with images to the eyes. It can also use light on the backside of image-recorded film to carry the image information to the eyes.

EXAMPLES

The following examples illustrate specific aspects of the present invention, and are not intended to limit the scope thereof in any respect, and should not be so construed.

Laser Marking

The example lenticular images were produced using a Videojet 7310 ytterbium fiber laser system, operated in pulse operation. The pulse energy peak power of pulsed lasers can be from 0.0384 J/mm² up to 3.84 J/mm², which corresponds to an intensity setting of 1% to 100%. The laser marking speed was from 1 mm/s to 20,000 mm/s. The setting was optimized to 35% intensity, and 5000 mm/s laser marking speed to generate the examples of the present invention.

Example 1. Structure of Photo-Substrates

Table 1 lists the 3D/flip films made in the laboratory, and tested successfully for recording images. Microscopic pictures of some lens layers used in Table 1 are shown in FIG. 8. Microscopic pictures of the marks left on the light-reacting materials after image(s) forming are analyzed and shown in FIG. 9. It can be seen that the marks correspond directly to each unit lens, images, and angles between the 3D film and collimated light.

Hemi-spherical and spherical lens layers provide one more dimension for rotation than the linear lens, or cylindrical lens, or other linear-shape lens. FIG. 1b gives a schematic drawing of how the 2-dimensional angular rotation could be used for changing the 2D angles between the 3D/flip film (such as Examples #9-15 in Table 1) and collimated light.

TABLE 1

| | | Photo-substrates | | | | |
|---|---|---|---|---|---|---|
| # | Lens Form | Lens Array/Supplier | W* (μm) | T** (μm) | T/W | Light-Reacting Material/ Supplier | Light used for recording images |
| 1 | Linear | 40 LPI Linear/ VueThru | 635 | 914 | 1.44 | ZAP-IT Laser Alignment Paper/ KENTEK Laser Store | 1055~1075 nm laser |
| 2 | Linear | 60 LPI Linear/ VueThru | 423 | 788 | 1.86 | ZAP-IT Laser Alignment Paper/ KENTEK Laser Store | 1055~1075 nm laser |
| 3 | Linear | 100 LPI Linear/ Pacur Lenstar | 254 | 368 | 1.45 | ZAP-IT Laser Alignment Paper/ KENTEK Laser Store | 1055~1075 nm laser |
| 4 | Linear | 40 LPI Linear/ VueThru | 635 | 914 | 1.44 | SPEL 2390, 13 μm coating/ Sun Chemical | 1055~1075 nm laser |
| 5 | Linear | 60 LPI Linear/ VueThru | 423 | 788 | 1.86 | SPEL 2390, 13 μm coating/ Sun Chemical | 1055~1075 nm laser |
| 6 | Linear | 100 LPI Linear/ Pacur Lenstar | 254 | 368 | 1.45 | SPEL 2390, 13 μm coating/ Sun Chemical | 1055~1075 nm laser |
| 7 | Linear | 60 LPI Linear/ VueThru | 423 | 788 | 1.86 | Photographic Emulsion/ Rockland Liquid Light | White visible light |
| 8 | Linear | 100 LPI Linear/ Pacar Lenstar | 254 | 368 | 1.45 | Photographic Emulsion/ Rockland Liquid Light | White visible light |
| 9 | Half-Spherical | HALS-H 250T-PP Honeycomb/ Grapac Japan | 125 | 250 | 2 | Photographic Emulsion/ Rockland Liquid Light | White visible light |
| 10 | Half-Spherical | HALS-H 250T-PP Honeycomb/ Grapac Japan | 125 | 250 | 2 | ZAP-IT Laser Alignment Paper/ KENTEK Laser Store | 1055~1075 nm laser |
| 11 | Spherical | Randomly-structured 500 um glass beads, monolayer/ glass beads from Scientific Industries | 500 +/− 200 | 500 +/− 200 | 1 | ZAP-IT Laser Alignment Paper/ KENTEK Laser Store | 1055~1075 nm laser |
| 12 | Spherical | Square-Structured 500 μm glass beads, monolayer/ glass beads from Scientific Industries | 500 +/− 100 | 500 +/− 100 | 1 | ZAP-IT Laser Alignment Paper/ KENTEK Laser Store | 1055~1075 nm laser |

TABLE 1-continued

| | | | Photo-substrates | | | |
|---|---|---|---|---|---|---|
| Lens # | Lens Form | Lens Array/Supplier | W* (μm) | T** (μm) | T/W | Light-Reacting Material/ Supplier | Light used for recording images |
| 13 | Spherical | Randomly-structured 100 μm glass beads, monolayer/ glass beads from Scientific Industries | 124 +/− 80 | 124 +/− 80 | 1 | ZAP-IT Laser Alignment Paper/ KENTEK Laser Store | 1055~1075 nm laser |
| 14 | Spherical | Randomly-structured Spheromer CA60 beads, monolayer/ PMMA beads from Microbeads AS | 60 +/− 50 | 60 +/− 50 | 1 | ZAP-IT Laser Alignment Paper/ KENTEK Laser Store | 1055~1075 nm laser |
| 15 | Spherical | Randomly-structured Spheromer CA30 beads, monolayer/ PMMA beads from Microbeads AS | 30 +/− 20 | 30 +/− 20 | 1 | ZAP-IT Laser Alignment Paper/ KENTEK Laser Store | 1055~1075 nm laser |

*W = unit width (μm) of an individual lens
**T = thickness of the lens array (μm)

Example 2. Art Examples Used to Test Photo-Substrates

FIG. 11 shows the art examples that were printed to test the linear lenticular lens photo-substrates of Ex. #1-8 in Table 1.

FIG. 12 shows the art examples that were printed to test the hemi-spherical/spherical lenticular lens photo-substrates of Ex. #9-15 in Table 1.

$(\alpha,\beta)$* in FIG. 12 indicates that angle (0°, 0°) is avoided because experiments show that an image recorded at this angle is shown at every possible observation angle for films with hemi-spherical and spherical lens layers.

The number of images being recorded is limited only by the resolving power of the lens array, which could be calculated by analysis of the marks left on the light-reacting material during image forming, as shown in FIG. 9. FIG. 9a2 shows the line widths in the marks for 5 images formed at each of 5 different angles between film and collimated light for Example #3 in Table 1. The line widths were measured, and are shown in Table 3.

TABLE 3

| Line widths from FIG. 9a | |
|---|---|
| Line # from Left to Right | Line Width (μm) |
| R1 | 20.6 |
| R2 | 24.8 |
| R3 | 30.1 |
| R4 | 29.6 |
| R5 | 20.6 |

Theoretically, Example #3 3D/flip film could hold 25400/100/(30.1~20.6)=approximately 8 to 12 images, if images could be angled towards the light-reacting materials by the lens layer. Similarly, the dotted patterns left on the light-reacting material in FIGS. 9b and 9c could be used for calculating the resolving power of hemi-spherical and spherical lens layers.

In FIGS. 9a1 and 9a2, we can see that the line patterns correspond very well to the Lenstar 100 LPI lens layer used in Example #3, and shown in FIG. 2b. The unit length is about 254 μm, and each line is directly formed according to each image under each unit lens at a certain angle between the incoming laser and the 3D/flip film/paper. The line numbers under each unit linear lens are equal to the number of the images and angles, which is an exact mimic of the step of interlacing images described for the traditional procedure for lenticular printing.

In FIGS. 9b1 to 9b4, we can see that the dot patterns correspond very well to the Grapac honeycomb-structure half-spherical lens layer used in Example #10, and shown in FIG. 2c. The unit length is about 127 μm, and each dot is formed according to each image under each unit half-spherical lens at a certain angle between incoming laser and the 3D/flip film/paper. It should be noted that, using traditional methods of lenticular printing, this lenticular lens structure was rarely used in 3D/flip real pictures (e.g. a human face), and was mostly used in combination with periodical shape images (such as star, mesh, and heart), with a unit length and structure matching the lens-pattern by Grapac Japan. Thus, the present invention provides a significant improvement to lenticular printing, because the honeycomb-structure half-spherical lenticular lens layer can be used for more complicated images, such as a human face, using the photo-substrate and methods of the present invention.

Figure 3C:
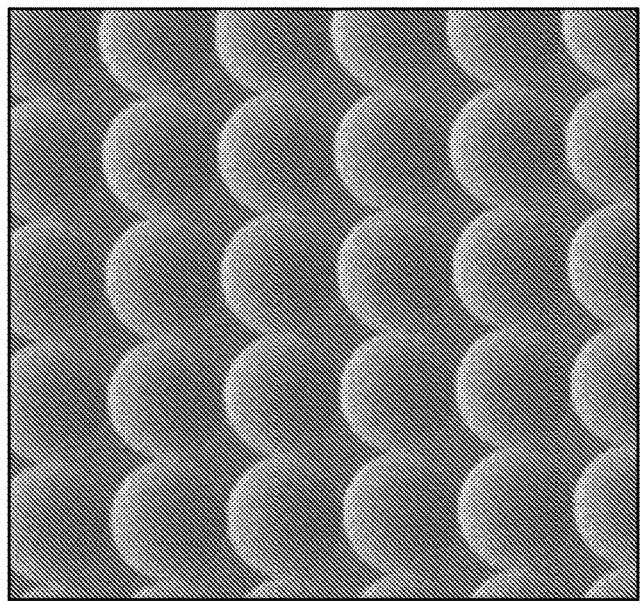
FIG. 3c.

In FIGS. 9c1 and 9c2, we can see that the marks left on the 3D/flip film correspond very well to the spherical lens layer used in Example #12, and shown in FIG. 3c. The unit length is about 500±150 μm, and each dot is formed according to each image under each unit spherical lens at a certain angle between incoming laser and the 3D/flip film/paper.

Thus, the examples show that the photo-substrate of the present invention, and the methods for using the photo-substrate to produce lenticular images, significantly improve the speed, quality, and range of uses of lenticular printing. The process of lenticular printing is simplified, and will therefore be accessible to more people.

The present invention has been described in detail, including the preferred embodiments thereof. However, it will be appreciated that those skilled in the art, upon consideration of the present disclosure, may make modifications and/or improvements on this invention that fall within the scope and spirit of the invention.

What is claimed:

1. A method of producing a 3D and/or flip and/or motion effect printed image or images comprising:
    a) providing a photo-substrate, wherein the photo-substrate comprises:
        i) a lenticular lens array; and
        ii) a substrate comprising one or more energy-reactive materials adhered to the backside of the lenticular lens array;
            wherein the photo-substrate is configured so that the lenticular lens array is in direct contact with the energy reactive materials, and the lenticular image is directly printed on the one or more energy-reactive materials through the lenticular lens array; and
            wherein the photo-substrate is a continuous web substrate;
    b) loading the photo-substrate on a roller train moving at a speed proportional to the recording ability of the substrate, wherein the lenticular image is imaged on the photo-substrate as the photo-substrate is moving; and
    c) providing:
        i) one or more Digital Light Processing (DLP) projectors; wherein the one or more DLP projectors project images through the lenticular lens array at different angles which correspond to the subsequent viewing geometry, at a speed synchronized to the speed of the photo-substrate movement; or
        ii) one or more lasers, each producing narrow and well collimated beams; wherein the one or more lasers are scanned and modulated back and forth across the photo-substrate through the lenticular lens array at different angles which correspond to the subsequent viewing geometry, as the photo-substrate is moved.

2. The method of claim 1, wherein the continuous web photo-substrate is a 3D/parallax movie film roll, wherein the 3D and/or flip and/or motion effects images are produced directly in a movie format.

3. The method of claim 1, wherein the lasers are Red, Green, Blue (RGB) lasers.

4. The method of claim 1, wherein step c) is providing one or more Digital Light Processing (DLP) projectors; wherein the one or more DLP projectors project images through the lenticular lens array at different angles which correspond to the subsequent viewing geometry, at a speed synchronized to the speed of the photo-substrate movement.

5. The method of claim 1, wherein one or more pre-patterned printed layers are incorporated into the 3D and/or flip and/or motion image before exposure of the photo-substrate.

6. A method of producing a 3D and/or flip and/or motion effect printed image or images comprising:
    a) providing a photo-substrate, wherein the photo-substrate comprises:
        i) a lenticular lens array; and
        ii) a substrate comprising one or more energy-reactive materials adhered to the backside of the lenticular lens array;
            wherein the photo-substrate is configured so that the lenticular lens array is in direct contact with the energy reactive materials, and the lenticular image is directly printed on the one or more energy-reactive materials through the lenticular lens array; and
            wherein the photo-substrate is a continuous web substrate;
    b) loading the photo-substrate on a roller train moving at a speed proportional to the recording ability of the substrate, wherein the lenticular image is imaged on the photo-substrate as the photo-substrate is moving; and
    c) providing:
        i) one or more Digital Light Processing (DLP) projectors; wherein the one or more DLP projectors project images through the lenticular lens array at different angles which correspond to the subsequent viewing geometry, at a speed synchronized to the speed of the substrate movement; or
        ii) one or more lasers, each producing narrow and well collimated beams; wherein the one or more lasers are scanned and modulated back and forth across the photo-substrate through the lenticular lens array at different angles which correspond to the subsequent viewing geometry, as the photo-substrate is moved;
    wherein the image or images are produced according to the Helmholtz law of reciprocity.

7. A method of producing a 3D and/or flip and/or motion effect printed image or images comprising:
    a) providing a photo-substrate, wherein the photo-substrate consists of:
        i) a lenticular lens array; and
        ii) a substrate comprising one or more energy-reactive materials adhered to the backside of the lenticular lens array;
            wherein the photo-substrate is configured so that the lenticular lens array is in direct contact with the energy reactive materials, and the lenticular image is directly printed on the one or more energy-reactive materials through the lenticular lens array; and
            wherein the photo-substrate is a continuous web substrate;
    b) loading the photo-substrate on a roller train moving at a speed proportional to the recording ability of the substrate, wherein the lenticular image is imaged on the photo-substrate as the photo-substrate is moving; and
    c) providing:
        i) one or more Digital Light Processing (DLP) projectors; wherein the one or more DLP projectors project images through the lenticular lens array at different angles which correspond to the subsequent viewing geometry, at a speed synchronized to the speed of the photo-substrate movement; or
        ii) one or more lasers, each producing narrow and well collimated beams; wherein the one or more lasers are scanned and modulated back and forth across the photo-substrate through the lenticular lens array at different angles which correspond to the subsequent viewing geometry, as the photo-substrate is moved.

8. A method of producing a 3D and/or flip and/or motion effect printed image or images comprising:
   a) providing a photo-substrate, wherein the photo-substrate consists of:
      i) a lenticular lens array; and
      ii) a substrate comprising one or more energy-reactive materials adhered to the backside of the lenticular lens array;
         wherein the photo-substrate is configured so that the lenticular lens array is in direct contact with the energy reactive materials, and the lenticular image is directly printed on the one or more energy-reactive materials through the lenticular lens array; and
         wherein the photo-substrate is a continuous web substrate;
   b) loading the photo-substrate on a roller train moving at a speed proportional to the recording ability of the substrate, wherein the lenticular image is imaged on the photo-substrate as the photo-substrate is moving; and
   c) providing:
      i) one or more Digital Light Processing (DLP) projectors; wherein the one or more DLP projectors project images through the lenticular lens array at different angles which correspond to the subsequent viewing geometry, at a speed synchronized to the speed of the substrate movement; or
      ii) one or more lasers, each producing narrow and well collimated beams; wherein the one or more lasers are scanned and modulated back and forth across the photo-substrate through the lenticular lens array at different angles which correspond to the subsequent viewing geometry, as the photo-substrate is moved;
   wherein the image or images are produced according to the Helmholtz law of reciprocity.

* * * * *